United States Patent
Tada et al.

(10) Patent No.: US 10,359,711 B2
(45) Date of Patent: Jul. 23, 2019

(54) LITHOGRAPHY APPARATUS, LITHOGRAPHY METHOD, LITHOGRAPHY SYSTEM, STORAGE MEDIUM, AND ARTICLE MANUFACTURING METHOD

(71) Applicant: CANON KABUSHIKI KAISHA, Tokyo (JP)

(72) Inventors: Yoshihito Tada, Utsunomiya (JP); Noburu Takakura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 91 days.

(21) Appl. No.: 14/661,370

(22) Filed: Mar. 18, 2015

(65) Prior Publication Data
US 2015/0268560 A1 Sep. 24, 2015

(30) Foreign Application Priority Data

Mar. 19, 2014 (JP) .................. 2014-055809
Feb. 23, 2015 (JP) .................. 2015-033180

(51) Int. Cl.
G03F 7/20 (2006.01)

(52) U.S. Cl.
CPC ...... *G03F 7/70991* (2013.01); *G03F 7/70525* (2013.01)

(58) Field of Classification Search
CPC .................. G03F 7/70525; G03F 7/70991
See application file for complete search history.

(56) References Cited

U.S. PATENT DOCUMENTS 6,584,371 B1 * 6/2003 Sada ................ G05B 19/4183
700/116
6,788,990 B1 * 9/2004 Yanaru ............ G05B 19/41865
700/103
6,870,601 B2 3/2005 Liebregts et al.
(Continued)

FOREIGN PATENT DOCUMENTS

CN 1475863 A 2/2004
CN 1525251 A 9/2004
(Continued)

OTHER PUBLICATIONS

Office Action issued in Chinese Appln. No. 201510121485.4, dated Sep. 5, 2016. English translation provided.
(Continued)

Primary Examiner — Deoram Persaud
(74) Attorney, Agent, or Firm — Rossi, Kimms & McDowell LLP

(57) ABSTRACT

Provided is a lithography apparatus that has a plurality of processing units each of which configured to perform processing of pattern formation for substrates. The lithography apparatus also has a controller configured to manage the plurality of processing units as groups in accordance with characteristics of the pattern formation respectively, allocate the substrates included in one or more lots to one of the groups, and, if an unprocessed substrate allocated to the group still exist upon a standby state of a processing unit included in the group, allocate the unprocessed substrate to the processing unit in the standby state and then cause the processing units to perform parallel processing for the substrates based on the allocation.

6 Claims, 19 Drawing Sheets

(56) References Cited

U.S. PATENT DOCUMENTS

| | | | | |
|---|---|---|---|---|
| 2002/0107599 A1* | 8/2002 | Patel | ...................... | G05B 17/02 |
| | | | | 700/99 |
| 2003/0076482 A1 | 4/2003 | Inoue | | |
| 2006/0155412 A1* | 7/2006 | Ikeda | ............... | G05B 19/41865 |
| | | | | 700/112 |
| 2011/0082579 A1* | 4/2011 | Yoshida | ............ | H01L 21/67276 |
| | | | | 700/101 |
| 2014/0037859 A1 | 2/2014 | Kobiki | | |
| 2014/0099176 A1* | 4/2014 | Nogi | ................. | H01L 21/67276 |
| | | | | 414/217 |
| 2014/0277668 A1* | 9/2014 | Oza | .................. | G05B 19/41865 |
| | | | | 700/101 |
| 2015/0022793 A1* | 1/2015 | Koga | .................. | G03F 7/70191 |
| | | | | 355/53 |

FOREIGN PATENT DOCUMENTS

| | | |
|---|---|---|
| JP | 2001257141 A | 9/2001 |
| JP | 2009075589 A | 4/2009 |
| JP | 2011210992 A | 10/2011 |
| JP | 2012006380 A | 1/2012 |
| JP | 2012009830 A | 1/2012 |
| JP | 2014033069 A | 2/2014 |
| KR | 1020110037896 A | 4/2011 |

OTHER PUBLICATIONS

Office Action issued in Japanese Appln. No. 2015-033180 dated Aug. 29, 2017. English translation provided.

Office Action issued in Korean Patent Application No. 10-2015-0037561 dated Jul. 13, 2017. English translation provided.

\* cited by examiner

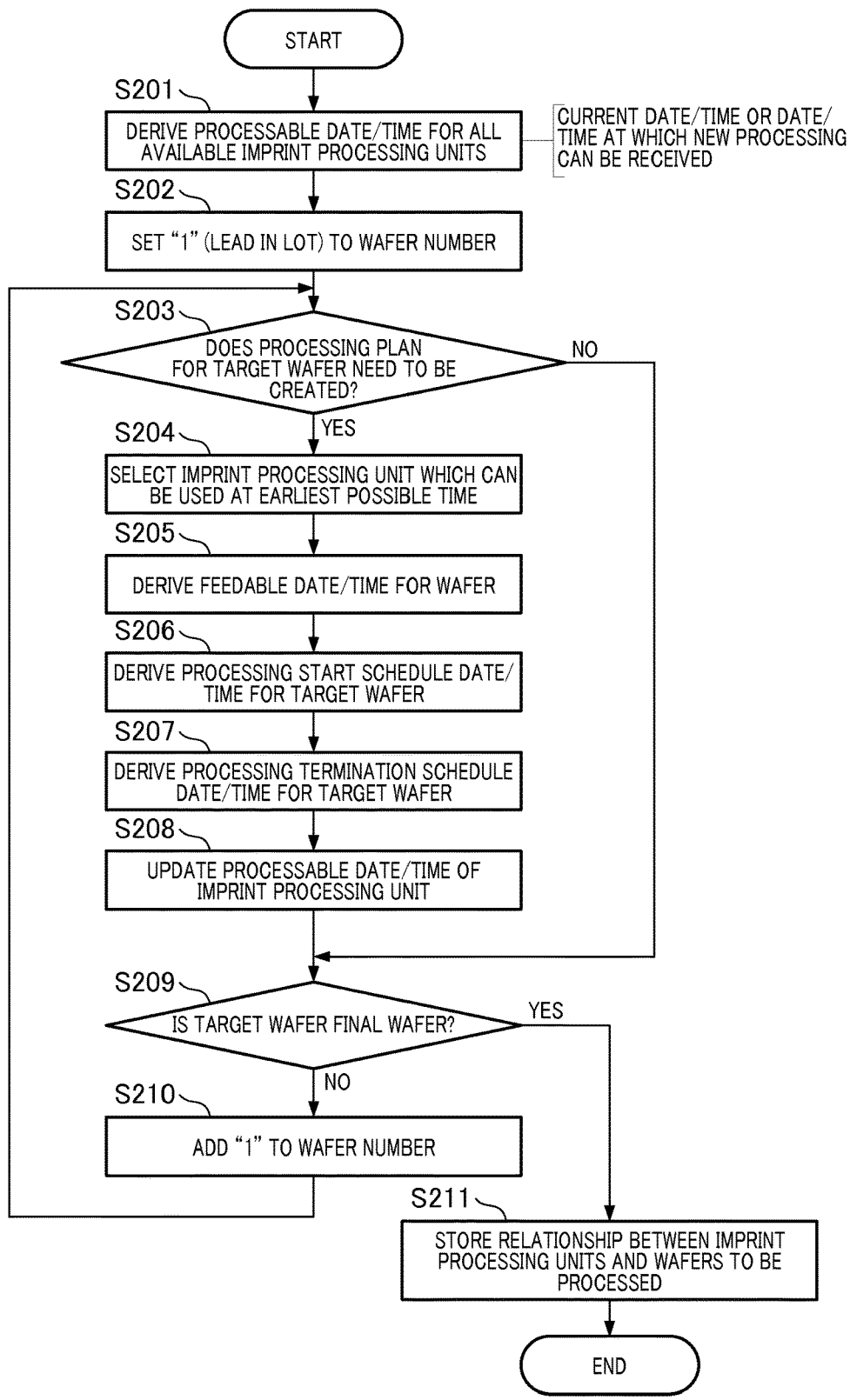

| Position number | X-coordinate | Y-coordinate | Type | Value |
|---|---|---|---|---|
| 001 | -12345.678 | 12345.678 | OL-X | 12.3 |
| 001 | -12345.678 | 12345.678 | OL-Y | 4.5 |
| 002 | 0.000 | 12345.678 | CD-X | 23.4 |
| 005 | 0.000 | 0.000 | CD-Y | 21.0 |
| : | : | : | CD-Y | 21.0 |

| Apparatus ID | Imprint processing unit ID | Data file name | Date/time of acquisition |
|---|---|---|---|
| UVIL01 | HD01 | UVIL01_01-OL | 2013/01/01 11:22:33 |
| UVIL01 | HD02 | UVIL01_02-OL | 2013/01/01 22:33:44 |
| UVIL02 | HD06 | UVIL02_06-CD | 2013/01/02 01:02:03 |
| : | : | : | : |

FIG. 8C

| Position number | Type | Error |
|---|---|---|
| 001 | OL-X | 6.5 |
| 001 | OL-Y | 9.0 |
| 002 | OL-X | 0.5 |
| : | : | : |

FIG. 8D

| Imprint processing unit ID | Type | Minimum value | Maximum value | Representative value |
|---|---|---|---|---|
| HD01 | OL-X | −7.5 | 6.5 | −0.5 |
| HD01 | OL-Y | −10.5 | 9.5 | −1.0 |

FIG. 8E

| | Group 1 | | | Group 2 | | |
|---|---|---|---|---|---|---|
| | HD01 | HD02 | HD03 | HD04 | HD05 | HD06 |
| OL-X | ⌽ | ⌽ | ⌽ | ⌽ | ⌽ | ⌽ — Maximum value / Representative value / Minimum value |
| OL-Y | ⌽ | ⌽ | ⌽ | ⌽ | ⌽ | ⌽ |

FIG. 9A

| Apparatus ID | Group ID | Imprint processing unit ID belonging thereto | Date/time of creation | Type of creation |
|---|---|---|---|---|
| UVIL01 | GRP001 | HD01, HD02, HD03 | 2013/01/01 11:22:33 | Manual |
| UVIL01 | GRP002 | HD04, HD05, HD06 | 2013/01/01 22:33:44 | Manual |
| UVIL01 | GRP003 | HD02, HD03, HD06 | 2013/01/02 01:02:03 | Automatic |
| UVIL02 | GRP001 | HD01, HD03 | 2013/01/03 10:20:30 | Automatic |
| UVIL01 | GRP004 | HD04 | 2013/01/10 12:04:03 | Manual |
| UVIL01 | GRP005 | HD05 | 2013/01/10 12:06:13 | Manual |
| UVIL01 | GRP006 | HD06 | 2013/01/10 12:08:22 | Manual |
| : | : | : | : | : |

FIG. 9B

| Apparatus ID | Imprint processing unit ID | Group ID to which it belongs |
|---|---|---|
| UVIL01 | HD01 | GRP001 |
| UVIL01 | HD02 | GRP001, GRP003 |
| UVIL01 | HD03 | GRP001, GRP003 |
| UVIL01 | HD04 | GRP002, GRP004 |
| UVIL01 | HD05 | GRP002, GRP005 |
| UVIL01 | HD06 | GRP002, GRP003, GRP006 |
| : | : | : |

FIG. 10A

| Lot ID | Apparatus ID | Wafer ID | Group ID | Imprint processing unit ID belonging thereto |
|---|---|---|---|---|
| LT01 | UVIL01 | L1W1〜L1W7 | GRP001 | HD01, HD02, HD03 |
| LT02 | UVIL01 | L2W1〜L2W9 | GRP001, GRP002 | HD01, HD02, HD03, HD04, HD05, HD06 |
| LT03 | UVIL01 | L3W1 L3W2 | GRP005 GRP006 | HD05 HD06 |

FIG. 10B

| Imprint processing unit ID | Processable date/time | Wafer ID to be processed |
|---|---|---|
| HD01 | 2013/03/03 00:30:00 | L1W1, L1W4, L1W7 |
| HD02 | 2013/03/03 00:20:15 | L1W2, L1W5 |
| HD03 | 2013/03/03 00:20:30 | L1W3, L1W6 |
| HD04 | 2013/03/03 00:00:00 | |
| HD05 | 2013/03/03 00:00:00 | |
| HD06 | 2013/03/03 00:00:00 | |

FIG. 10C

| Imprint processing unit ID | Processable date/time | Wafer ID to be processed |
|---|---|---|
| HD01 | 2013/03/03 00:30:00 | L1W1, L1W4, L1W7 |
| HD02 | 2013/03/03 00:30:15 | L1W2, L1W5, L2W7 |
| HD03 | 2013/03/03 00:30:30 | L1W3, L1W6, L2W8 |
| HD04 | 2013/03/03 00:38:00 | L2W1, L2W4, L2W9 |
| HD05 | 2013/03/03 00:38:15 | L2W2, L2W5, L3W1 |
| HD06 | 2013/03/03 00:38:30 | L2W3, L2W6, L3W2 |

FIG. 14A

| JobID | Lot ID | Wafer ID | Imprint processing unit ID list | Processing unit change condition code |
|---|---|---|---|---|
| Job01 | LT01 | L1W1 | HD01, HD02 | C1 |
| | | L1W2 | HD02, HD01 | C1 |
| | | L1W3 | HD01, HD02 | C1, C2 |
| | | L1W4 | HD02, HD01 | C1, C2 |
| | | L1W5 | HD01, HD02 | C1, C2 |
| Job02 | LT02 | L2W1 | HD01, HD02, HD03 | C1, C2, C3 |
| | | L2W2 | HD02, HD01, HD04 | C1, C2, C3 |
| | | L2W3 | HD01, HD02, HD03 | C1, C2, C3 |

FIG. 14B

| Processing unit change condition code | Status indicated by processing unit change condition code |
|---|---|
| C1 | Imprint processing unit is defective |
| C2 | Imprint processing unit is stopped for assist waiting |
| C3 | Vacancy latency of imprint processing unit exceeds allowable value |
| C4 | : |

FIG. 18A

| JobID | Lot ID | Wafer ID | Processing unit selection method specifying list | | Processing unit selection method detail condition | Processing unit change condition code |
|---|---|---|---|---|---|---|
| | | | Method number | Selection method | | |
| Job01 | LT01 | L1W1 | 1 | ID list | HD01, HD02 | C1 |
| | | | 2 | Group ID | GRP001 | — |
| | | | 3 | ID list | HD03, HD04, HD05 | C1, C2 |
| | | L1W2 | 1 | Allowable error | OL-X=8.0, OL-Y:7.9, ...... | — |
| | | L1W3 | 1 | ID list | HD01, HD02, HD03, HD04 | C1, C2, C3 |
| | | | 2 | Allowable error | OL-X=10, OL-Y:11, ...... | — |
| | | L1W4 | 1 | ID list | HD01 | — |
| | | L1W5 | 1 | Group ID | GRP001, GRP002 | — |

FIG. 18B

| Processing unit change condition code | Status indicated by processing unit change condition code |
|---|---|
| C1 | Imprint processing unit is defective |
| C2 | Imprint processing unit is stopped for assist waiting |
| C3 | Vacancy latency of imprint processing unit exceeds allowable value |
| C4 | : |

LITHOGRAPHY APPARATUS, LITHOGRAPHY METHOD, LITHOGRAPHY SYSTEM, STORAGE MEDIUM, AND ARTICLE MANUFACTURING METHOD

BACKGROUND OF THE INVENTION

Field of the Invention

The present invention relates to a lithography apparatus, a lithography method, a lithography system, a storage medium, and an article manufacturing method.

Description of the Related Art

Lithography apparatuses form a pattern on a workpiece (substrate) in a lithography step included in steps of manufacturing articles such as semiconductor devices, MEMSs, and the like. An example of lithography apparatuses includes an imprint apparatus that molds an uncured resin on a substrate using a mold so as to form a resin pattern on the substrate. For example, the imprint apparatus employing a photo-curing method firstly coats an uncured photocurable resin on a substrate and cures the resin under to irradiation of light in a state where the resin is brought into contact with a mold. After the resin is cured, the substrate is spaced from the mold (the substrate is released from the mold), whereby a resin pattern is formed on the substrate. However, such imprint apparatuses exhibit a poor productivity as compared with other lithography apparatuses such as exposure apparatuses. Thus, Japanese Patent Laid-Open No. 2011-210992 discloses a cluster-type imprint apparatus that includes a plurality of imprint modules (hereinafter simply referred to as "modules"), a conveyance mechanism which is shared between the modules, and the like so as to improve the productivity as a whole.

However, it is difficult for the imprint apparatus to perform complex pattern shape correction. In addition, since it is difficult for the cluster-type imprint apparatus to match the characteristics of a plurality of modules, the shape of the pattern formed by using one cluster-type imprint apparatus varies for each module which forms a pattern if the shape of the pattern is strictly checked. This means that, even if a lot consisting of a substrate group of a fixed quantity (e.g., 25 wafers) is processed (patterned) by using only one cluster-type imprint apparatus, a pattern transfer error may occur when the lot is processed by different modules included therein. On the other hand, in order to keep high pattern transfer accuracy, a method for operating the cluster-type imprint apparatus by fixing the relationship between substrates and individual modules in advance may be conceived. However, in production lines, substrates are fed to and recovered from the cluster-type imprint apparatus by taking a lot as a management unit and the number of substrates included in a lot decreases along with the progress of production. Thus, the simple fixation of the relationship between substrates and individual modules may readily cause a module to sit in the standby state in which no substrate is fed, resulting in a reduction in productivity.

Hence, Japanese Patent Laid-Open No. 2001-257141 discloses a process control apparatus that groups a plurality of apparatuses into groups of apparatuses while focusing on their characteristics and then changes the management target from individual apparatuses to the groups of apparatuses so as to manage the relationship between the groups of apparatuses and lots.

Here, the application of the process control apparatus disclosed in Japanese Patent Laid-Open No. 2001-257141 to a controller for controlling modules included in the cluster-type imprint apparatus is not readily adaptable to typical production lines. In other words, in order to apply the process control apparatus to the current production lines by setting a substrate as a unit for management, an MES (Manufacturing Execution System) and in-plant conveyance equipment need to be replaced at the plant factory equipment level. In the cluster-type imprint apparatus, the conveyance mechanism is shared between modules within the apparatus, and thus, substrates cannot be independently fed/recovered between individual modules and the exterior of the apparatus, which is also another reason for being unable to apply the process control apparatus to the current production lines.

SUMMARY OF THE INVENTION

The present invention provides a lithography apparatus advantageous in terms of suppressing a reduction in productivity while ensuring an improvement in pattern formation accuracy.

According to an aspect of the present invention, a lithography apparatus is provided that includes a plurality of processing units each of which configured to perform processing of pattern formation for substrates; and a controller configured to manage the plurality of processing units as groups in accordance with characteristics regarding the pattern formation respectively, allocate the substrates included in one or more lots to one of the groups, and, if an unprocessed substrate allocated to the group still exist upon a standby state of a processing unit included in the group, allocate the unprocessed substrate to the processing unit in the standby state and then cause the processing units to perform parallel processing for the substrates based on the allocation.

Further features of the present invention will become apparent from the following description of exemplary embodiments (with reference to the attached drawings).

BRIEF DESCRIPTION OF THE DRAWINGS

FIG. 6 is a flowchart illustrating a wafer allocation step.

FIGS. 8A to 8E illustrate characteristic data and creation of groups.

FIGS. 9A and 9B illustrate group information about imprint processing units.

FIGS. 10A to 10C are tables illustrating lot processing by group designation.

FIGS. 14A and 14B are tables illustrating an exemplary processing unit ID list.

FIGS. 18A and 18B are tables illustrating an exemplary selection method list.

DESCRIPTION OF THE EMBODIMENTS

Hereinafter, preferred embodiments of the present invention will be described with reference to the drawings.

First Embodiment

Firstly, a description will be given of a lithography apparatus according to a first embodiment of the present invention. The lithography apparatus according to the present embodiment is so-called a cluster-type lithography apparatus that includes a plurality of lithography patterning units which perform pattern formation processing in parallel (parallel processing) for a substrate fed from a preprocessing apparatus to be described below. Hereinafter, in the present embodiment, a description will be given by taking an example of a cluster-type imprint apparatus (hereinafter simply referred to as "cluster apparatus") in which lithography processing units are used as imprint processing units (imprint module, individual imprint apparatus).

Figure 1:
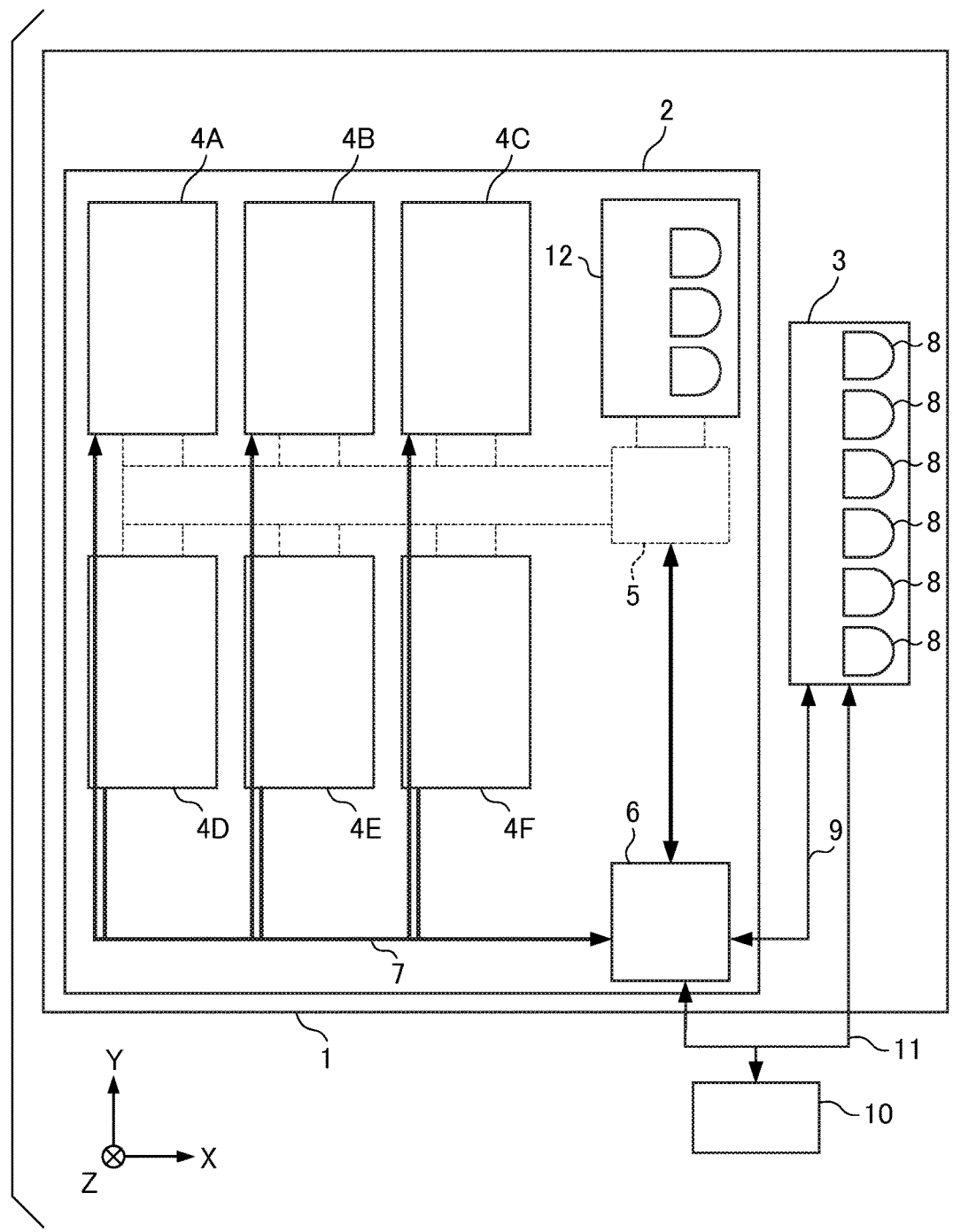
FIG. 1 illustrates a configuration of an imprint system according to a first embodiment of the present invention.

FIG. 1 is a schematic plan view illustrating configurations of a cluster apparatus 2 according to the present embodiment and an imprint system 1 including the cluster apparatus 2. The imprint system 1 includes the cluster apparatus 2 and a preprocessing apparatus 3. The cluster apparatus 2 includes a plurality of (e.g., six in the present embodiment) imprint processing units 4 (4A to 4F), a substrate conveyance unit 5, a cluster controller 6, and a substrate storage unit 12.

Figure 2:
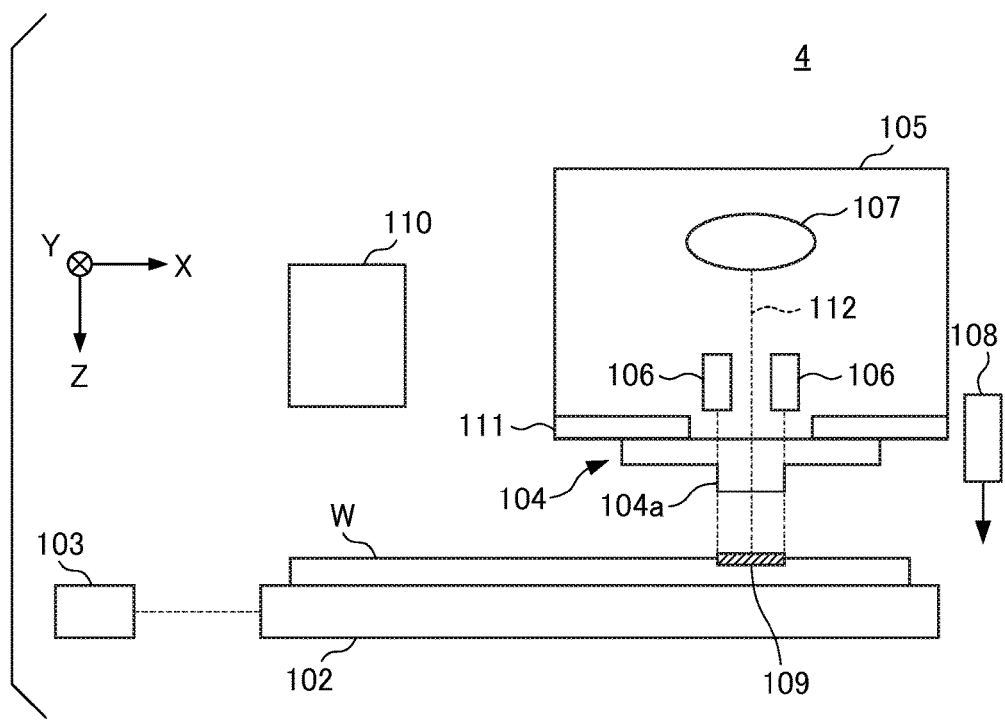
FIG. 2 illustrates a configuration of an imprint processing unit.

FIG. 2 is a schematic view illustrating a configuration of a single imprint processing unit (hereinafter simply referred to as "processing unit") 4. The processing unit 4 performs a lithography step in steps of manufacturing articles such as semiconductor devices. The processing unit 4 molds an uncured resin 109 fed on a wafer W (on a substrate), i.e., a substrate to be processed, using a mold 104 so as to form the pattern formed by the resin 109 on the wafer W. Here, the processing unit 4 employs a photo-curing method. In FIGS. 1 and 2, a description will be given where the Z axis is aligned parallel to the optical axis of an illumination system 107 that irradiates the resin 109 on the wafer W with ultraviolet light, and mutually orthogonal axes X and Y are aligned in a plane perpendicular to the Z axis. The processing unit 4 includes an imprint structure 105 including an illumination system 107, a mold holding mechanism 111, and an alignment measurement system (scope) 106, a wafer stage 102, an dispenser 108, and an internal processing unit controller 110.

The illumination system 107 adjusts ultraviolet light 112 emitted from a light source into a light suitable for imprint and irradiates the resin 109 with the adjusted ultraviolet light 112 via the mold 104 during imprint processing. While lamps such as mercury lamps may be used as the light source, the illumination system (light source) 107 is not particularly limited to one that illuminates UV light as long as it emits light that transmits through the mold 104 and has a wavelength at which the resin (imprint material) 109 is cured. While, in the present embodiment, the illumination system 107 is provided because the photo-curing method is employed, a heat source for curing a thermosetting resin is provided instead of the illumination system 107 when the heat-curing method is employed.

The outer peripheral shape of the mold 104 is a polygon (preferably, rectangular or square) and the mold 104 includes a pattern section 104a (e.g., the concave and convex pattern of a circuit pattern or the like to be transferred), which is three-dimensionally formed on the surface facing the wafer W. While there are various pattern sizes depending on the type of articles to be manufactured, a fine pattern size at ten additional nano-scales may also be included. It is desirable that the material of the mold 104 is capable of permitting the passage of the ultraviolet light 112 and has low thermal expansion. An exemplary material of the mold 104 may be quartz.

The mold holding mechanism 111 has a mold chuck that holds the mold 104 and a mold drive mechanism that holds the mold chuck and moves the mold 104, none of which is shown. The mold chuck may hold the mold 104 by suctioning or attracting the outer peripheral region of the surface of the mold 104 irradiated with the ultraviolet light 112 using a vacuum suction force or an electrostatic force. Also, each of the mold chuck and the mold drive mechanism has an aperture region at the central portion (the inside thereof) such that the ultraviolet light 112 emitted from the illumination system 107 transmits through the mold 104 and directs toward the wafer W. The mold drive mechanism moves the mold 104 in each axis direction so as to selectively press the mold 104 against the resin 109 on the wafer W or release the mold 104 from the resin 109. Examples of a power source employable for the mold drive mechanism include a linear motor, an air cylinder, and the like. The mold drive mechanism may also be constituted by a plurality of drive systems such as a coarse movement drive system, a fine movement drive system, and the like in order to accommodate positioning of the mold 104 with high accuracy. Furthermore, the mold drive mechanism may have a position adjustment function for adjusting the position of the mold 104 not only in the Z-axis direction but also in the X-axis direction, the Y-axis direction, or the θ (rotation about the Z axis) direction, a tilt function for correcting the tilt of the mold 104, and the like. The pressing operation and the releasing operation during imprint processing may be realized by moving the mold 104 in the Z-axis direction, may be realized by moving the wafer stage 102 in the Z-axis direction, or may also be realized by moving both the mold 104 and the wafer stage 102 relative to each other.

The alignment measuring system 106 optically observes an alignment mark pre-formed on the mold 104 and an alignment mark pre-formed on the wafer W so as to measure a relative positional relationship therebetween.

The wafer W is, for example, a single crystal silicon substrate or an SOI (Silicon on Insulator) substrate, and an ultraviolet curable resin, i.e., the resin 109, which is molded by the pattern section 104a formed on the mold 104, is coated on the treatment surface of the wafer W.

The wafer stage 102 holds the wafer W and executes positioning between the mold 104 and the resin 109 when the mold 104 is pressed against the resin 109 on the wafer W. The wafer stage 102 has a wafer chuck that holds the wafer W by a suction force and a stage drive mechanism that holds the wafer chuck by a mechanical unit and is movable at least in a direction along the surface of the wafer W, none of which is shown. Examples of a power source employable for the stage drive mechanism include a linear motor, a planar motor, and the like. The power source operates based on a drive command from a stage controller 103. The stage drive mechanism may also be constituted by a plurality of drive systems such as a coarse movement drive system, a fine movement drive system, and the like in the X-axis and Y-axis directions. Furthermore, the stage drive mechanism may also have a drive system for adjusting the position of the wafer W in the Z-axis direction, a position adjustment function for adjusting the position of the wafer W in the θ direction, a tilt function for correcting the tilt of the wafer W, and the like.

The dispenser 108 is installed near the mold holding mechanism 111 and coats the resin 109 in an uncured state on a shot as a pattern forming region which is present on the wafer W. Here, the resin 109 is a photocurable resin (imprint material) having the property of being cured by being irradiated with the ultraviolet light 112, and is appropriately selected depending on various conditions for the steps of manufacturing devices or the like. The amount of the resin 109 to be dispensed (ejected) from the dispenser 108 is also appropriately determined by a desired thickness of the resin 109 to be formed on the wafer W, the density of the pattern to be formed, or the like.

The internal processing unit controller 110 controls the operation, adjustment, and the like of the components of the processing unit 4. The internal processing unit controller 110 includes a calculation unit such as a CPU or a DSP and a storage unit such as a memory or a hard disk for storing recipe or the like, none of which is shown. Here, recipe is information (data) consisting of a series of processing parameters used upon processing the wafer W or a lot which is a wafer group for which the same processing is performed. Examples of the processing parameters include a layout of shots, the order of shots to be subject to imprint processing, an imprint condition for each shot, and the like. Examples of the imprint condition include a filling time during which the mold 104 is pressed against the resin 109 coated on the wafer W and an exposure time during which the resin 109 is cured by being irradiated with the ultraviolet light 112. Another example of the imprint condition includes the coating amount of resin which is the amount of the resin 109 to be coated onto each shot. The internal processing unit controller 110 receives a recipe from the cluster controller 6, and then performs imprint processing for the wafer W carried in by the substrate conveyance unit 5 based on the recipe.

Referring back to FIG. 1, the substrate conveyance unit 5 (indicated by a broken line portion in FIG. 1) conveys (delivers) the wafer W among the preprocessing apparatus 3, the processing units 4, and the substrate storage unit 12. Although not specifically shown, the substrate conveyance unit 5 may be a conveyance robot including hands for holding the wafer W. The substrate storage unit 12 temporarily stores the wafer W in the cluster apparatus 2.

The cluster controller (controller) 6 controls the operation, adjustment, and the like of the components of the cluster apparatus 2. The cluster controller 6 is comprised of, for example, an information processing apparatus (computer). The processing (imprint method) according to the present embodiment may be executed as a program by the information processing apparatus. The cluster controller 6 is communicatively connected to the processing units 4 and the substrate conveyance unit 5 via an internal communication line (communication line) 7, and receives/transmits a control signal and various types of information (recipe) from/to the processing units 4 and the substrate conveyance unit 5.

Figure 3:
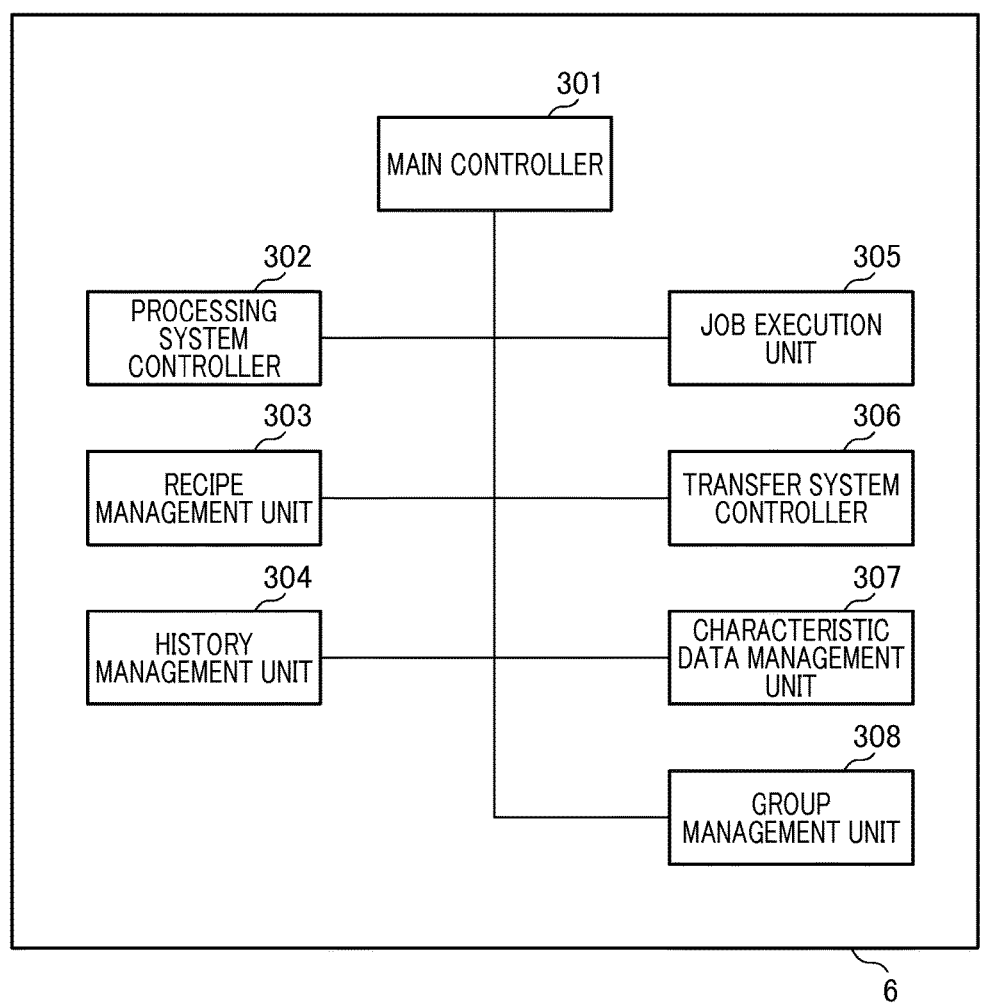
FIG. 3 illustrates a configuration of a cluster controller according to the first embodiment.

FIG. 3 is a block diagram illustrating a configuration of the cluster controller 6. The cluster controller 6 includes a main controller 301, a processing system controller 302, a recipe management unit 303, a history management unit 304, a job execution unit 305, a conveyance system controller 306, a characteristic data management unit 307, and a group management unit 308. The processing system controller 302 executes the job (processing command) that is for the inside of the cluster apparatus 2 and is generated by the job execution unit 305 to manage the states of the individual processing units 4 as management information. The recipe management unit 303 manages a recipe in which all the parameters required for performing desired imprint processing are recorded, wherein one setting parameter group is specified by the combination of the recipe and recipe revision. Here, recipe revision is used for generational management of a recipe ID which do not change even if the content of a recipe is edited and the edition result. The history management unit 304 records the job processing result and the operation history of all units (the processing unit 4, the substrate conveyance unit 5, and the like) constructing the cluster apparatus 2. The job execution unit 305 decomposes the cluster apparatus 2-level job given from the exterior (a supervisory controller 10 to be described below) into internal jobs at the processing unit 4-level to manage the progress of the job of the entire cluster apparatus 2 based on the progress status of the internal jobs. The conveyance system controller 306 controls the delivery operation of the wafer W including the driving control of the substrate conveyance unit 5. The characteristic data management unit 307 manages information (characteristic data) indicating the characteristics regarding pattern formation by the processing units 4 in association with the individual processing units 4. Furthermore, the group management unit 308 receives and manages information (group information) for defining characteristic data and a group configuration to be described below.

Figure 4:
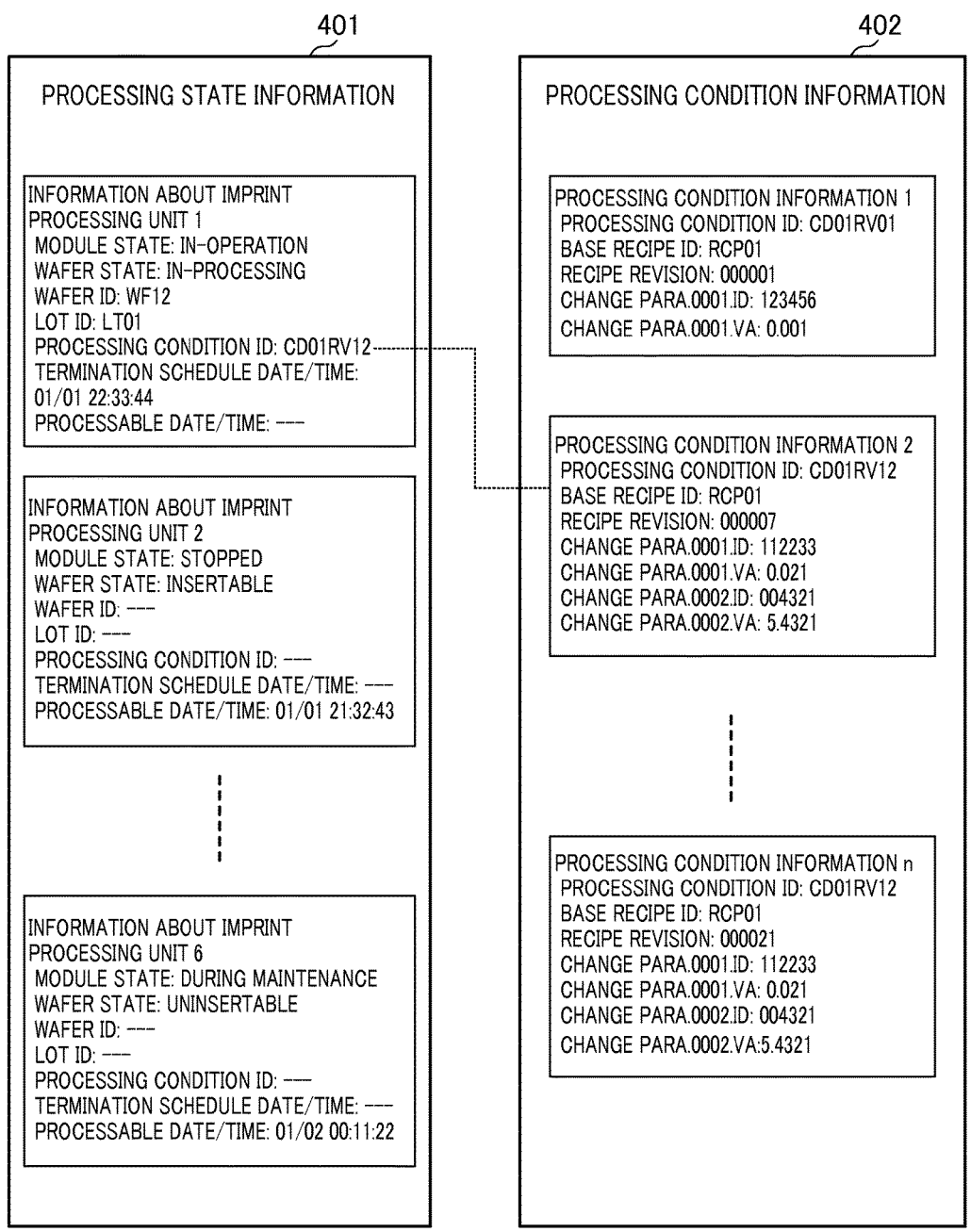
FIG. 4 illustrates information managed by a processing system controller.

FIG. 4 is a diagram illustrating an example of management information managed by the processing system controller 302. More specifically, the processing system controller 302 manages processing state information 401 which is detailed information regarding the operating status of the processing units 4 and processing condition information 402 for defining the processing content in the processing units 4. The processing state information 401 has one setting for each processing unit 4, includes the operating state of the processing units 4 and their attribute information, and is updated in real time depending on the progress of processing in the processing units 4. The cluster controller 6 can readily grasp what kind of processes are performed by the respective processing units 4, when a new process can be started, or the like with reference to the processing state information 401. Furthermore, the processing condition information 402 is a detailed processing condition of the wafer W (hereinafter referred to as "target wafer") to be processed at this time. The processing condition information 402 also includes recipe IDs for specifying reference recipe information and their recipe revision, and parameter IDs which are difference information (temporal change in content) from the reference recipe information and their parameters.

Referring again back to FIG. 1, the preprocessing apparatus 3 is a cleaning device or a coating device that performs preprocessing such as cleaning of the wafer W, coating of a close contact layer, or the like for the wafer W in a lot designated by the cluster apparatus 2. The preprocessing apparatus 3 may install (house) a substrate storage container (FOUP) 8 for storing the wafers W in one lot by the number of the processing units 4 which are responsible for processing the wafers W. Also, a communication connection is established between the cluster controller 6 and the preprocessing apparatus 3 via an external communication line (communication line) 9 to transmit/receive conveyance commands required for convey the wafers W and the identification information of the substrate. When the preprocessing apparatus has higher throughput than that of the cluster apparatus 2, the wafer W for which preprocessing has been completed is temporarily stored until the wafer W is carried out based on a substrate request from the cluster apparatus 2.

Furthermore, as in the conventional supervisory controller present in a manufacturing location (e.g. semiconductor manufacturing factory) for manufacturing articles (e.g. semiconductor devices) using imprint apparatuses, the supervisory controller 10 performs data transmission/reception between various types of manufacturing apparatuses so as to generally control the entire manufacturing steps. As in other manufacturing apparatuses, the imprint system 1 including the cluster apparatus 2 according to the present embodiment is connected to the supervisory controller 10 via a communication network 11 such as a local area network within a manufacturing location or the like.

Figure 5:
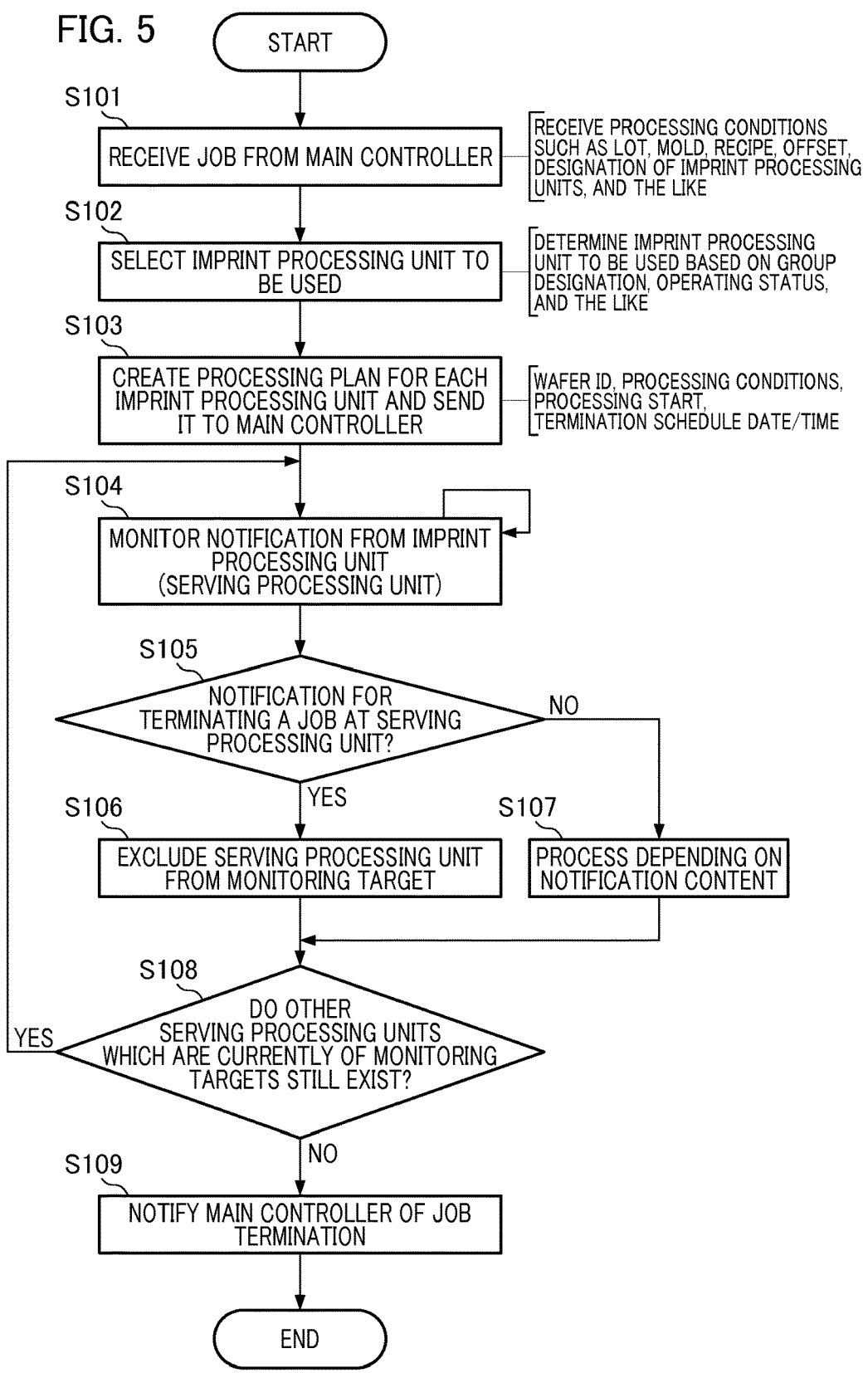
FIG. 5 is a flowchart illustrating a processing step performed by a job execution unit.

Next, a specific description will be given of wafer processing performed by the cluster apparatus 2 (the imprint system 1). FIG. 5 is a flowchart illustrating the flow of processing from generation of an internal job executed within the cluster apparatus 2 to completion of imprint processing by the processing units 4. Firstly, the job execution unit 305 receives a job from the main controller 301 (step S101). The job includes material-related information such as lot, the wafer W, the mold 104, and the like, apparatus parameters such as recipe, offset settings, and the like, and restrictions on designation of the processing units 4 or the like. Next, the job execution unit 305 selects the processing unit 4 for executing the job acquired in step S101 (step S102). At this time, the job execution unit 305 refers to information for limiting the processing units 4 as candidates for selection and available/unavailable information such as an alarm occurrence state, a maintenance plan, or the like. This allows the processing units 4 determined as available to be selected taking into account of the operating status of the entire cluster apparatus 2. Next, the job execution unit 305 allocates the target wafer W one by one to the processing units 4 selected in step S102 to create a processing plan for all the wafers W (step S103). The job execution unit 305 sends the created processing plan to the main controller 301, and the main controller 301 sends a command based on the processing plan to the processing system controller 302 and the conveyance system controller 306. Note that allocation of the wafers W (association between the processing units 4 and the target wafer W) will be described below in detail. Next, the job execution unit 305 monitors the operating status of the processing units 4 (hereinafter referred to as "serving processing units") to which processing of the wafers W has been allocated in step S103 (step S104). Here, the job execution unit 305 shifts the processing to the following step S105 upon receipt of some notification from the serving processing unit 4. Next, the job execution unit 305 determines whether or not the notification received in step S104 is a notification for terminating a job at the serving processing unit 4 (step S105). Here, if the job execution unit 305 determines that the notification received in step S104 is a job termination notification (including an abnormal termination due to an error) (YES), the job execution unit 305 excludes the serving processing unit 4 from the monitoring target in step S104 (step S106). Note that, prior to excluding the serving processing unit 4 from the monitoring target, the job execution unit 305 confirms that there is no remaining wafer W to be processed by the serving processing unit 4 at this time. On the other hand, if the job execution unit 305 determines in step S105 that the notification received in step S104 is not a job termination notification (NO), the job execution unit 305 confirms the notification content and then determines whether or not the notification relates the processing to be executed by the job execution unit 305 to execute appropriate processing as required (step S107). For example, if the notification from the serving processing unit 4 is the one relating to the progress of a job such as suspension caused by an alarm or the like, the job execution unit 305 executes processing such as waiting for a job resumption notification. Next, the job execution unit 305 determines whether or not other processing units 4 which are currently of the monitoring targets still exist as a result of execution of the processing depending on the notification content (step S108). Here, if the job execution unit 305 determines that the monitoring targets still exist (YES), the job execution unit 305 returns the processing back to step S104 to continue monitoring. On the other hand, if the job execution unit 305 determines that no monitoring target exists (NO), the job sent from the exterior to the main controller 301 has been terminated, and thus, the job execution unit 305 notifies the main controller 301 of the termination of the job (step S109).

Next, a detailed description will be given of allocation of the wafers W in step S103. FIG. 6 is a flowchart illustrating the flow of the allocation step of the wafers W. Firstly, the job execution unit 305 confirms the operating status of the available processing units 4 one by one and then derives the date/time (hereinafter referred to as "processable date/time") at which each processing unit 4 can start the wafer processing (step S201). Here, the processable date/time is current date/time if the processing unit 4 is in a processing standby state, whereas the processable date/time is the predicted next date/time (the date/time at which new processing can be received) at which the processing unit 4 becomes in a processing standby state if the processing unit 4 is in processing. Next, prior to the following repetition processing, the job execution unit 305 sets the initial value "1" to the leading number of wafers in a lot (step S202). Next, the job execution unit 305 determines whether or not the processing plan for the target wafer W needs to be created (step S203). Here, if the job execution unit 305 determines that no such processing plan needs to be created (NO), the processing shifts to the following step S209. On the other hand, if the job execution unit 305 determines in step S203 that the processing plan needs to be created (YES), the job execution unit 305 selects the processing unit 4 which is capable of start processing for the target wafer W at the earliest possible time (step S204). In other words, the job execution unit 305 selects the processing unit 4 of which the processable date/time derived in step S201 is the earliest date/time. Next, the job execution unit 305 derives the date/time (hereinafter referred to as "feedable date/time") at which the substrate conveyance unit 5 can feed the target wafer W to the processing unit 4 (step S205). Next, the job execution unit 305 compares the processable date/time derived in step S201 with the feedable date/time derived in step S205 to derive the later date/time as the processing start schedule date/time for the target wafer W (step S206). Next, the job execution unit 305 derives a time required for processing the target wafer W and then adds the time to the processing start schedule date/time derived in step S206 to thereby derive the processing termination schedule date/time for the target wafer W (step S207). Here, the time required for processing is used as a reference for clarifying the sequential order at which the processing unit 4 is in a processing standby state, and thus, does not require strict accuracy. The job execution unit 305 may also derive the time required for processing by estimation based on the processing condition designated by the recipe and the past processing performance stored in the history management unit 304. Next, the job execution unit 305 derives the date/time (new processable date/time) at which the serving processing unit 4 is capable of being in a processing standby state taking into account of a time required for post-processing or the like, and then updates the previous processable date/time to the derived date/time (step S208). Next, the job execution unit 305 determines whether or not the target wafer W is the final wafer (step S209). Here, if the job execution unit 305 determines that the target wafer W is not the final wafer (NO), the job execution unit 305 adds "1" to the number of wafers in the lot, and returns the processing back to step S203 (step S210). In other words, the job execution unit 305 repeats the processing from step S203 to S208 before reviewing all the target wafers W. If the job execution unit 305 determines in step S209 that the target wafer W is the final wafer, i.e., if the processing plans for all the target wafer W have completely created (YES), the relationship between the obtained processing units 4 and the wafers to be processed is stored (step S211).

Next, a description will be given of the characteristic data indicating the characteristics (formation characteristics) regarding pattern formation of the processing unit 4 and its management method. In general, the imprint apparatus has a small area on which the pattern can be formed, and thus, cannot collectively form the pattern over the entire surface of the wafer W. Thus, as in, for example, the semiconductor exposure apparatus, the imprint apparatus sequentially forms the pattern over a plurality of shots on the wafer W while performing step driving to thereby finally form a plurality of similar patterns over the entire surface of the wafer W. At this time, the individual differences in the processing units 4 appear on the formed individual patterns, and thus, it is preferable that the characteristics thereof be managed for each processing unit 4.

Figures 7A, 7B, 7C:
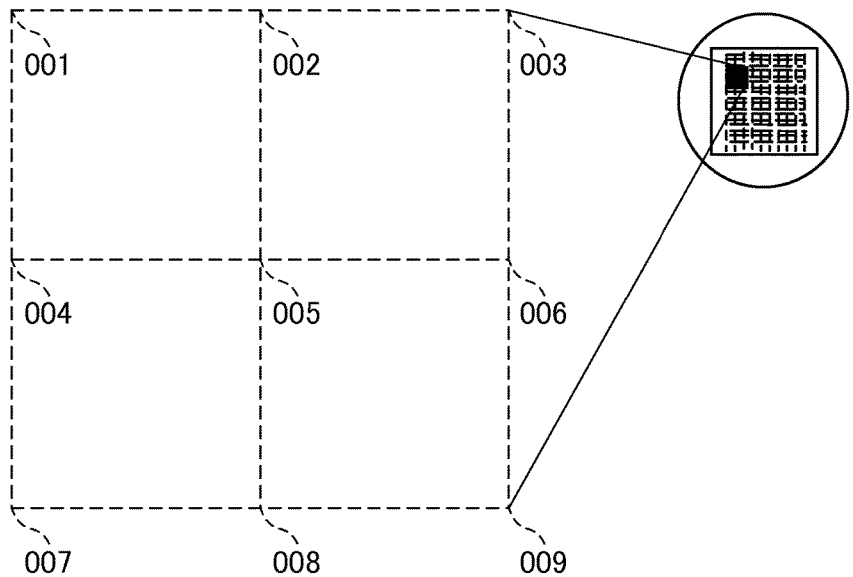
FIGS. 7A to 7C illustrate characteristic data of imprint processing units.

FIGS. 7A to 7C are diagrams illustrating characteristic data indicating the characteristics regarding pattern formation of the processing units 4. Among them, FIG. 7A is an enlarged plan view illustrating one shot on the wafer W. In order to convert the characteristics of a shot pattern into numbers, nine positions (position numbers 001 to 009) are defined as those of interest in FIG. 7A as an example. Since the number of characteristics of interest is not one such as overlay (OL), resolution width (CD), and the like, the positions of interest may be changed depending on the respective requests. FIG. 7B is a table illustrating the relationship between the positions of interest shown in FIG. 7A and individual characteristic values obtained by measurement thereof. For example, information described in the first row includes a value indicating the overlay characteristic in the X-axis direction at the position of the position number 001. Information described in the second row includes the overlay characteristic in the Y-axis direction at the position of the position number 001, information described in the third row includes the resolution width characteristic in the X-axis direction at the position of the position number 002, and so on. FIG. 7C is a table illustrating characteristic data when the characteristic values (pattern formation characteristics) shown in FIG. 7B are managed as characteristic data files. For example, information described in the first row indicates a data file on which the characteristic of the processing unit 4 having the processing unit ID of HD01 in the cluster apparatus 2 having the apparatus ID of UVIL01 is recorded together with the name of the data file and the date/time of acquisition. Note that the management method with use of characteristic data described above is merely an example, but the type of data to be managed and the management method thereof may be freely changed as long as the requirements for managing the specific characteristic values of the specific processing unit 4 provided in the specific apparatus can be met. In addition, a specific method for acquiring (measuring) these characteristic values is not particularly limited, but these characteristic values may be acquired by a typically used method using typical evaluation equipment (mold, wafer, and measuring equipment).

Next, a description will be given of the method for grouping the processing units 4 exhibiting similar characteristics. Here, it is assumed as an example that a pattern is formed as an overlay reference step in the next step and the processing units 4 are grouped into groups while focusing on the absolute accuracy.

Figure 8A:
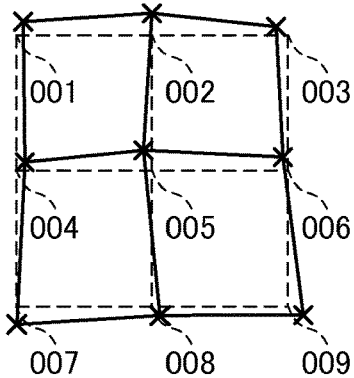
Figure 8B:
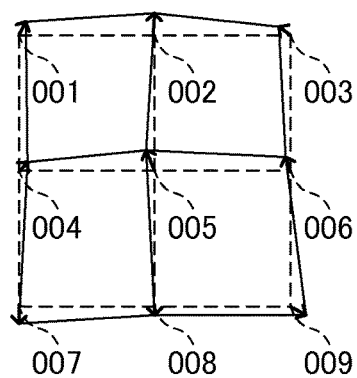

FIGS. 8A to 8E are diagrams illustrating grouping of the processing units 4. Among them, FIG. 8A is a plan view illustrating the state where the characteristic values are non-zero with respect to the nine positions of interest (these positions are positions when all the characteristic values are zero and hereinafter referred to as "reference positions") shown in FIG. 7A. The characteristic values in the state where the characteristic values are non-zero are individual differences in the processing units 4. FIG. 8B is a diagram illustrating errors at positions (characteristic evaluation points) corresponding to the reference positions, where the errors are represented by vectors (arrows). FIG. 8C is a table listing the respective errors in the X-axis direction and the Y-axis direction in FIG. 8B. FIG. 8D is a table listing the numeral values of the characteristics of the processing units 4 with respect to the reference positions by determining the statistical values for the errors shown in FIG. 8C for the respective processing units 4. FIG. 8E is an output diagram illustrating the trend of the characteristic data of all the processing units 4 included in the cluster apparatus 2, where the trend is used as a reference for creation of groups. As can be seen in the example shown in FIG. 8E, the characteristics in the Y-axis direction are little difference between the processing units 4 as the trend of the cluster apparatus 2 but the characteristics in the X-axis direction can be divided into two groups. In this case, two groups are created.

FIGS. 9A and 9B are tables illustrating the created group information. Among them, FIG. 9A is a table listing a group ID attached for each created group and the processing units 4 belonging to each individual group together with the date/time of creation and the type of creation (manual or automatic). On the other hand, FIG. 9B is a reverse lookup table of that shown in FIG. 9A. The created group information is databased and stored in a state where the information can be referenced or changed as appropriate even when running of the cluster apparatus 2.

Next, a description will be given of the flow of lot processing. FIGS. 10A to 10C are tables illustrating lot processing by group designation based on the assumption that the request for processing three lots is sent from the exterior (the supervisory controller 10) to the cluster controller 6. Among them, FIG. 10A is a table illustrating the wafer IDs of the wafers W included in each of the three lots, the group IDs associated therewith, and the processing units 4 belonging to each group. The job execution unit 305 in the cluster controller 6 creates a processing plan in which the processing units 4 are allocated to all the wafers W included in three lots.

Firstly, the individual wafers W included in the first lot having the lot ID of LT01 are allocated to the processing units 4. FIG. 10B is a table illustrating the result of allocation of the wafers W included in the first lot to the processing units 4 belonging to the first group having the group ID of GRP001. The first lot includes seven wafers W, and these seven wafers W are allocated to three processing units 4. Consequently, the processable date/time of the processing unit 4 (processing unit ID: HD01) which processes one more wafer W than the other processing units 4 becomes the latest as described above. At this point, wafer processing is allocated only to the processing units 4 belonging to the first group to which the first lot processing has been input, and the other processing units 4 not belonging to the first group are in a standby state of waiting for a wafer.

Next, the individual wafers W included in the second lot which is a lot subsequent to the first lot and has the lot ID of LT02 are allocated to the processing units 4. Here, a timing constraint specifying a timing event at which the leading wafer W included in the second lot is passed by the preprocessing apparatus 3 needs to be taken into consideration. In general, because of its specifications, the preprocessing apparatus 3 can carry out the wafers W in the second lot to the cluster apparatus 2 only after the final wafer W in the first lot has been carried out to the cluster apparatus 2. Thus, the cluster controller 6 instructs the substrate conveyance unit 5 to temporarily retract the wafers W included in the first lot to the substrate storage unit 12 to progress conveyance such that the preprocessing apparatus 3 can deliver the wafers W included in the second lot at an earlier point in time. Consequently, the cluster apparatus 2 becomes ready for receiving the wafer W after the elapse of about, for example, 8 mins. In this manner, the job execution unit 305 sequentially allocates the processing of the wafers W to three processing units 4 (processing unit ID: HD04, HD05, and HD06) belonging to the second group which has been idled and has the group ID of GRP002. The second lot includes nine wafers W. Firstly, upon selection of the processing units 4 which process the seventh wafer W and the subsequent wafers in the second lot, the job execution unit 305 allocates the wafers W in the second lot to two processing units 4 (processing unit ID: HD02 and HD03) which can start processing at an earlier point in time after completion of the processing of the wafers W in the first lot. Then, the job execution unit 305 allocates the final wafer W (target wafer ID: L2W9) in the second lot to the processing unit 4 having the processing unit ID of HD04.

Next, two wafers W included in the third lot which is a lot subsequent to the second lot and has the lot ID of LT03 are allocated to the processing units 4. The job execution unit 305 allocates the first wafer W (target wafer ID: L3W1) in the third lot to the processing unit 4 which belongs to the group having the group ID of GRP005 and has the processing unit ID of HD05. Next, the job execution unit 305 allocates the second wafer W (target wafer ID: L3W2) to the processing unit 4 which belongs to the group having the group ID of GRP006 and has the processing unit ID of HD06 so that the processing plan of all the wafers W included in three lots shown in FIG. 10A is completely created.

As described above, the cluster apparatus 2 firstly limits the processing units 4 to be used from among a plurality of processing units 4 depending on the type of lot only to a part of processing units 4 having similar characteristics, resulting in an improvement in pattern formation accuracy (leading to overlay accuracy). Furthermore, if unprocessed wafers W still exist in the second lot or the third lot upon the standby state of the processing units 4 included in the first group after termination of the processing for the first lot, the cluster apparatus 2 allocates those unprocessed wafers W to the first group. In this manner, a waiting time of waiting for carrying-in of the wafer W can be reduced as much as possible, so that a reduction in productivity can be suppressed.

As described above, according to the present embodiment, a cluster-type lithography apparatus and a lithography system advantageous in terms of suppressing a reduction in productivity while ensuring an improvement in pattern formation accuracy may be provided.

Note that, in the above description, the processing units 4 included in the second group are held in the standby state until the processing units 4 are ready for receiving the wafers W in the second lot. In contrast, the job execution unit 305 may also set the conveyable date/time from the supervisory controller 10 or the preprocessing apparatus 3 as the receivable date/time. In this manner, the job execution unit 305 can create the processing plan of the processing units 4 included in the second group at an earlier point in time.

Second Embodiment

Figure 11:
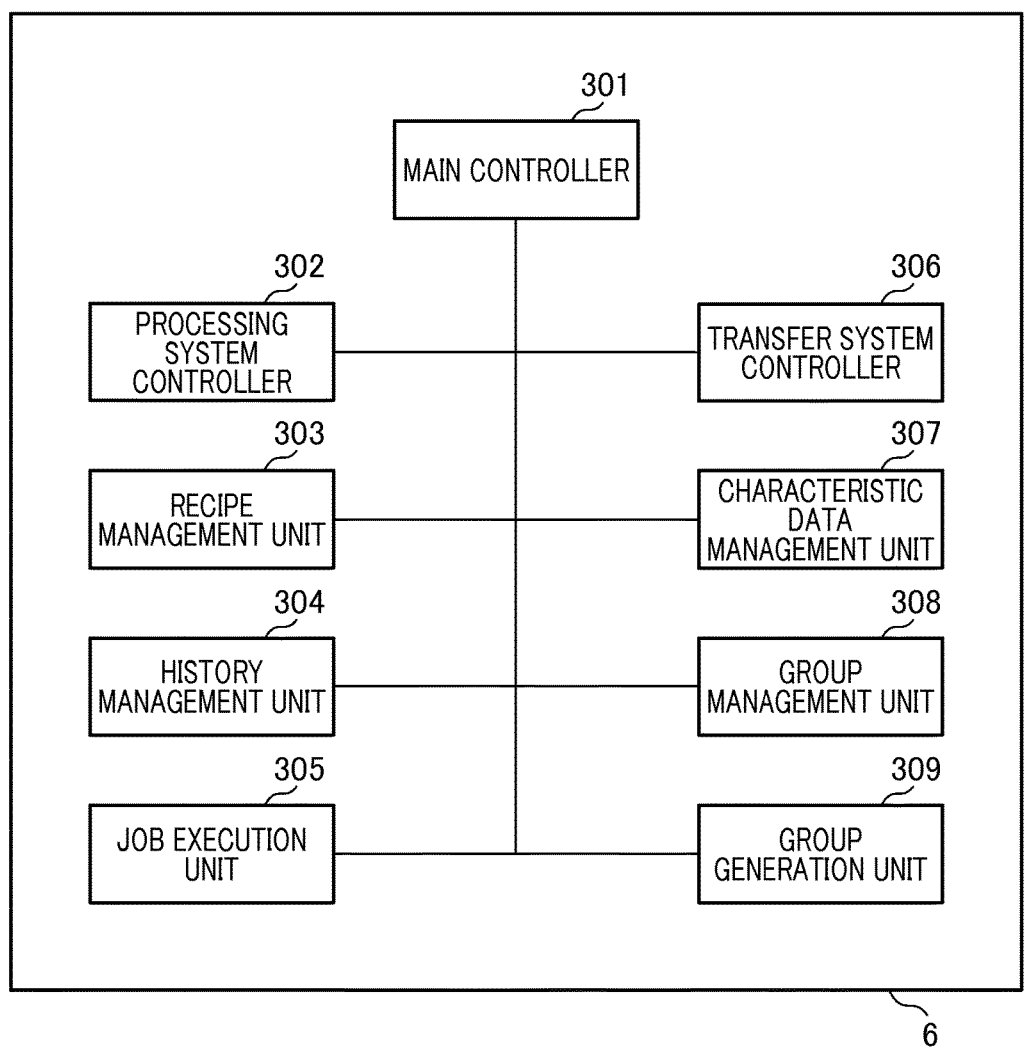
FIG. 11 illustrates a configuration of a cluster controller according to a second embodiment.

Next, a description will be given of a lithography apparatus according to a second embodiment of the present invention. FIG. 11 is a block diagram illustrating a configuration of a cluster controller included in the lithography apparatus of the present embodiment. In FIG. 11, for convenience in explanation, the same components as those corresponding to the cluster controller 6 in the first embodiment are designated by the same reference numerals and explanation thereof will be omitted. A feature of the lithography apparatus according to the present embodiment lies in the fact that a group generation unit 309 configured to generate the groups of the processing units 4 immediately before lot processing is additionally provided in the cluster controller 6 in the lithography apparatus (the cluster apparatus 2) according to the first embodiment. The group generation unit 309 generates the groups of the processing units 4 in cooperation with the history management unit 304, the characteristic data management unit 307, and the group management unit 308 such that a production error depending on the characteristic data of the processing units 4 falls within a predetermined range. The group information generated thereby is later sent to the exterior supervisory controller 10, and the supervisory controller 10 finally specifies the group of the processing units 4 based on the received group information.

Figure 12:
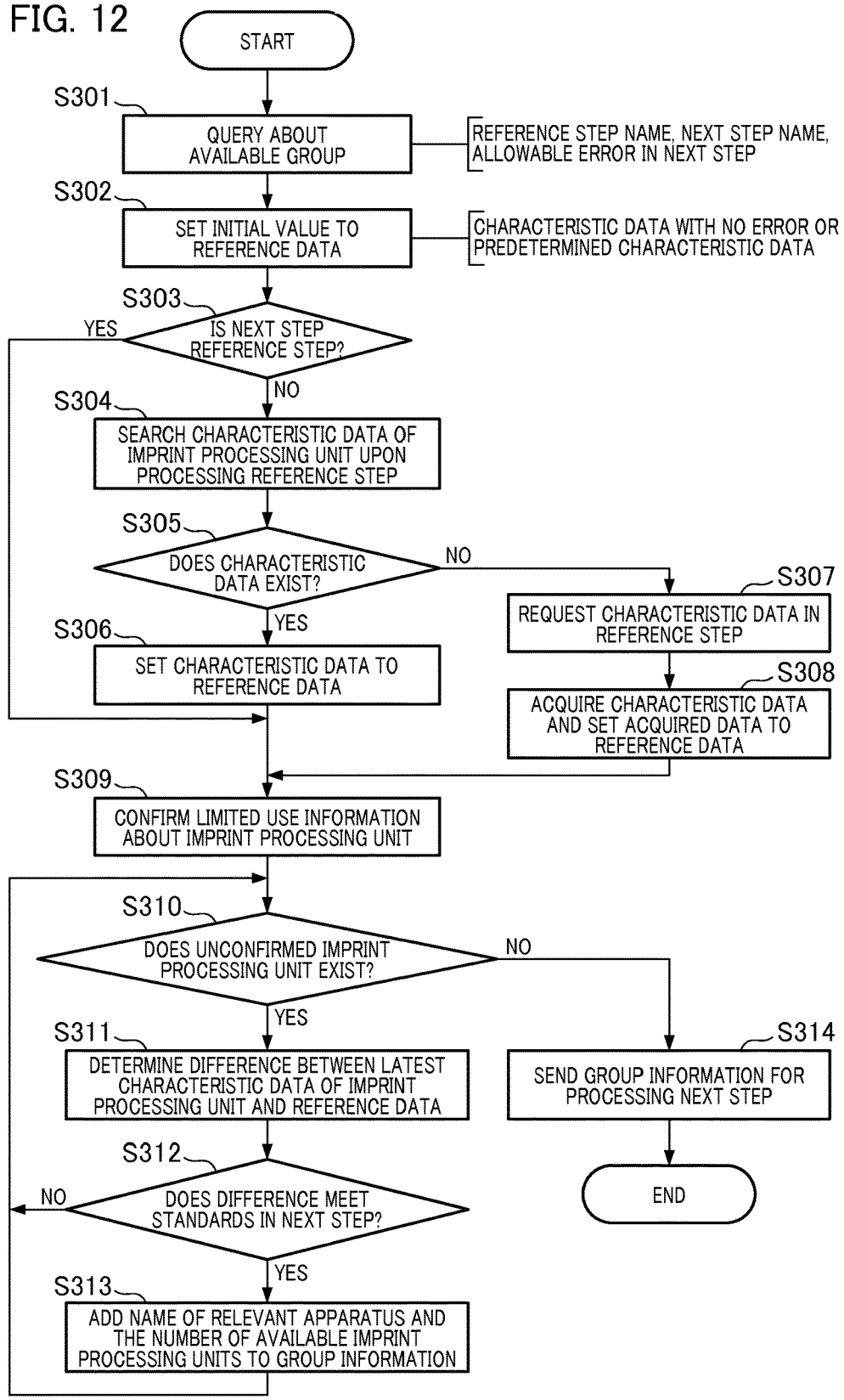
FIG. 12 is a flowchart illustrating a step of generating groups for imprint processing units.

FIG. 12 is a flowchart illustrating the flow of group generation by the group generation unit 309. Firstly, the group generation unit 309 queries the exterior (the supervisory controller 10) about any available group in order to specify a cluster apparatus 2 for performing the next step (the next pattern formation step) and generate a group of the processing units 4 in the cluster apparatus 2 (step S301). The query specifies the name of the next step and the name of the step (reference step) as a reference of the next step together with an allowable error in the next step in order to determine whether or not the processing units 4 are available. A specific communication method and a specific communication timing are not limited but may be freely changed as long as the requirements for querying until the implementation command for the processing of the next step is made from the exterior can be met.

Next, the group generation unit 309 sets the initial values to reference data (reference positions corresponding to the position numbers 001 to 009 shown in FIG. 7A in the first embodiment) as a source of comparison (step S302). If it is determined that a predetermined error is uniformly added to characteristic data without using the characteristic data with no error as described above as reference data, the characteristic data with substantially no error can be determined by setting the relevant error is set to reference data.

Next, the group generation unit 309 determines whether or not the next step is the reference step (step S303). Here, if the group generation unit 309 determines that the next step is the reference step (YES), the group generation unit 309 omits the following characteristic data acquisition processing, and directly shifts the processing to step S309. On the other hand, if the group generation unit 309 determines that the next step is not the reference step (NO), the group generation unit 309 searches the processing history for processing the reference step to specify the processing unit 4 which has processed the step and its processing date/time. Then, the group generation unit 309 searches the characteristic data of the processing unit 4, which has been acquired at a timing immediately before the processing date/time of the reference step, i.e., at a timing before the processing date/time but closest thereto, from the characteristic data management unit 307 (step S304). Next, the group generation unit 309 determines whether or not characteristic data corresponding to the processing history in question exists in the cluster apparatus 2 (step S305). Here, if the group generation unit 309 determines that the corresponding characteristic data still exists (remains) (YES), the group generation unit 309 sets the characteristic data to reference data (step S306). On the other hand, if the group generation unit 309 determines that the corresponding characteristic data does not exist or no processing history exists in the cluster apparatus 2 (NO), the group generation unit 309 notifies the supervisory controller 10 of the fact to request characteristic data in the reference step (step S307). Then, the group generation unit 309 acquires characteristic data in the reference step after step S307 and sets the characteristic data to reference data.

Next, the group generation unit 309 confirms limited use information about the processing units 4 in order to determine the candidates of the processing units 4 which perform processing in the next step (step S309). This confirmation is basically made for excluding the processing units 4 which are incapable of performing new processing due to failure, maintenance, or the like from targets. Note that the group generation unit 309 also excludes the processing units 4 which are designated for disablement in step S301 for reasons of not performing accuracy confirmation in the step from the candidates. Next, the group generation unit 309 determines whether or not the processing units 4 for which the following characteristic data evaluation is not performed (unconfirmed) still exist from among the processing units 4 selected as candidates (step S310). Here, if the group generation unit 309 determines that unconfirmed processing units 4 still exist (YES), the group generation unit 309 acquires the latest characteristic data for the specific processing unit 4 from among the unconfirmed processing units 4. Then, the group generation unit 309 compares the latest characteristic data with the set reference data to determine an index value for determining whether or not the specific processing unit 4 is available (step S311). More specifically, the group generation unit 309 sets the characteristic data for the processing units 4 to the characteristic data (corresponding to those shown in FIG. 8A in the first embodiment) under consideration to thereby determine a difference between characteristic data and reference data. Next, the group generation unit 309 determines whether or not the index value determined in step S311 meets standards in the next step as evaluation of the characteristic data for the processing unit 4 (falls within an allowable range) (step S312). Here, if the group generation unit 309 determines that the index value meets standards in the next step (YES), the group generation unit 309 adds identification information (processing unit ID or the like) about the processing unit 4 to the group information in the cluster apparatus 2 to update the number of available processing units 4 in the group (step S313). Note that the number of available processing units 4 is set to "1" when the first available processing unit 4 is found and then is added by "1" each time the available processing unit 4 is found. Then, the processing returns back to step S310 and the group generation unit 309 repeats the processing from step S310 to S313 until no unconfirmed processing unit 4 remains. On the other hand, if the group generation unit 309 determines in step S312 that the index value does not meet standards in the next step (NO), the processing returns back to step S310 because the processing unit 4 cannot be used, and evaluation for another processing unit 4 is started.

Then, if the group generation unit 309 determines in step S310 that no unconfirmed processing unit 4 exists (NO), the processing shifts to step S314, and the group generation unit 309 sends group information for processing the next step to a query source (i.e., the supervisory controller 10) (step S314). The group information includes at least identification information (apparatus ID or the like) about the cluster apparatus 2 and the number of available processing units 4.

As described above, according to the present embodiment, in addition to the effects of the first embodiment, how many available processing units 4 exist in the specific cluster apparatus 2 can be determined at any timing based on the assumption that the specific cluster apparatus 2 is used in the specific step. In particular, as viewed from the entire imprint system 1, the supervisory controller 10 acquires the information from the cluster apparatus 2, so that a specific cluster apparatus 2 having a large number of available processing units 4 from among a plurality of cluster apparatuses 2 and the group of the processing units 4 at this time can be readily specified. Then, the system configuration in the present embodiment may be minimally changed in scale based on the system configuration in the first embodiment.

Third Embodiment

Figure 13:
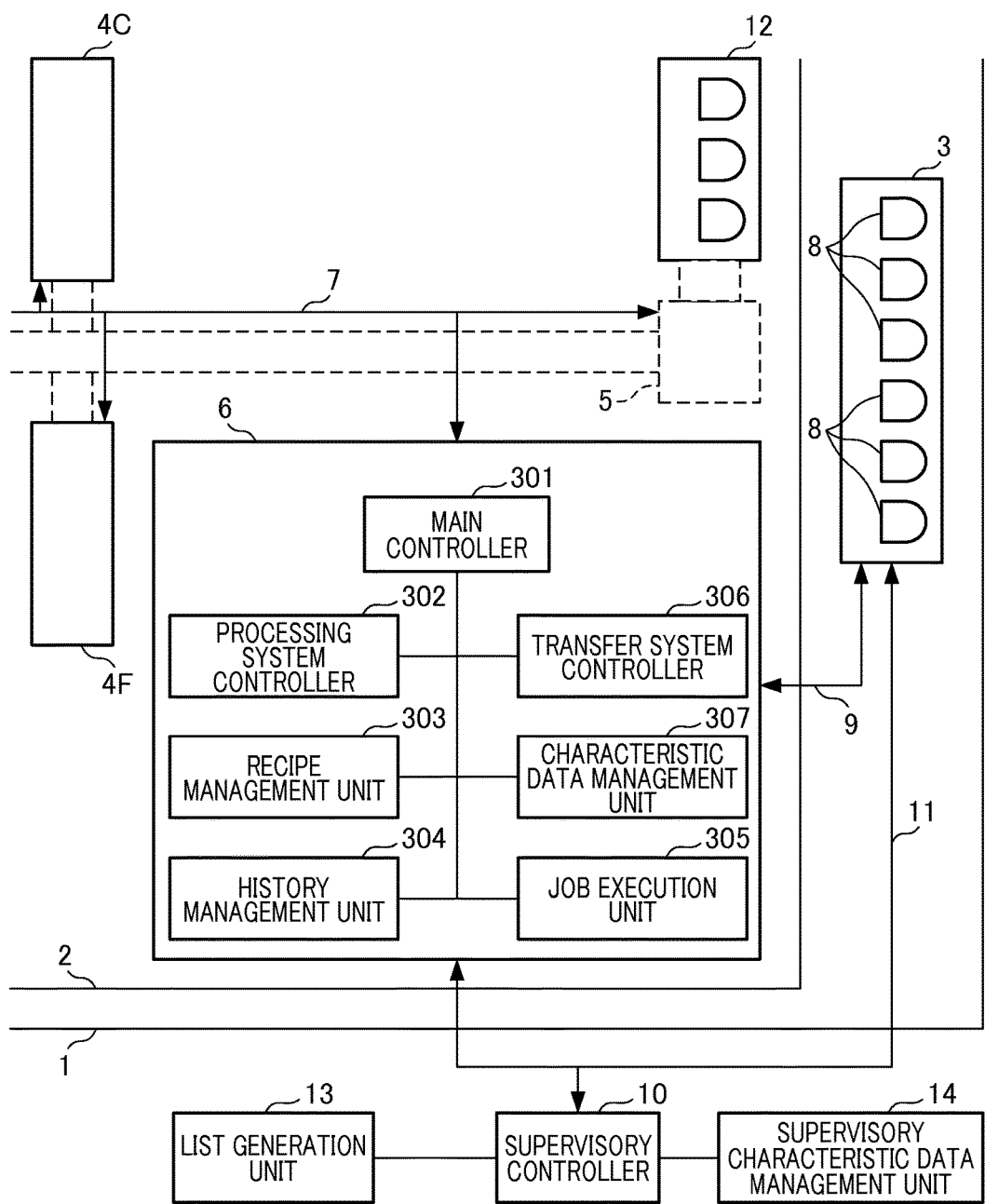
FIG. 13 is a partial diagram illustrating a configuration focusing on a cluster controller according to a third embodiment.

Next, a description will be given of a lithography apparatus according to a third embodiment of the present invention. FIG. 13 is a partial diagram illustrating a configuration focusing on a cluster controller included in the lithography apparatus according to the present embodiment. In FIG. 13, for convenience in explanation, the same components as those corresponding to the imprint system 1 in the first embodiment are designated by the same reference numerals and explanation thereof will be omitted. A feature of the lithography apparatus according to the present embodiment lies in the fact that the cluster controller 6 in the lithography apparatus (the cluster apparatus 2) according to the first embodiment obtains a processing unit ID list indicating the order of priority of the processing units 4 from a list generation unit 13 via the supervisory controller 10. The list generation unit 13 is communicatively connected to the cluster controller 6 and a supervisory characteristic data management unit 14 via the supervisory controller 10, and receives/transmits a control signal and various types of information from/to the cluster controller 6 and the supervisory characteristic data management unit 14. The supervisory characteristic data management unit 14 manages characteristic data for all the processing units 4 included in the cluster apparatus 2 communicatively connected to the supervisory controller 10 in association with the individual processing units 4. The list generation unit 13 acquires characteristic data from the supervisory characteristic data management unit 14 via the supervisory controller 10, and then generates a processing unit ID list in which the order of priority of the processing units 4 as candidates is defined upon allocation of the wafers W to the imprint processing units 4 based on the characteristic data. Upon selection of the processing units 4 for executing a job, the job execution unit 305 refers to the processing unit ID list and information regarding the operating status of the processing units 4 such as an alarm occurrence state, a maintenance plan, or the like. In this manner, the processing unit 4 with the highest priority is selected while taking into consideration of the operating status of the entire cluster apparatus 2.

FIGS. 14A and 14B are tables illustrating an exemplary processing unit ID list generated by the list generation unit 13. FIG. 14A is an example of the processing unit ID list obtained when the order of priority is defined such that the processing unit 4 having high pattern formation accuracy is prioritized at a higher level and FIG. 14B is a table illustrating the status of processing unit change condition codes shown in FIG. 14A. Here, the term "processing unit change condition" refers to a condition upon change of the processing unit 4 to one with lower order of priority. When, for example, the processing plan for the wafer W having the wafer ID of "L1W1" is created by using the processing unit ID lists shown in FIGS. 14A and 14B, the processing units 4 as candidates for selection are the processing units 4 having the processing unit IDs of the "HD01" and "HD02". If the processing unit 4 having the processing unit ID of "HD01" of which the order of priority is at a higher priority level meets the processing unit change condition: "C1: imprint processing unit is defective", the job execution unit 305 selects the processing unit 4 having the processing unit ID of "HD02" at a lower priority level as the processing unit 4 to be used for processing the wafer W having the wafer ID of "L1W1". While the order of priority is defined based on pattern formation accuracy, the present invention is not limited thereto but the order of priority may also be defined based on other performances such as throughput or the like. The processing unit change conditions are also not limited to the conditions shown in FIG. 14B but may be applied to any event detectable by software.

Figure 15:
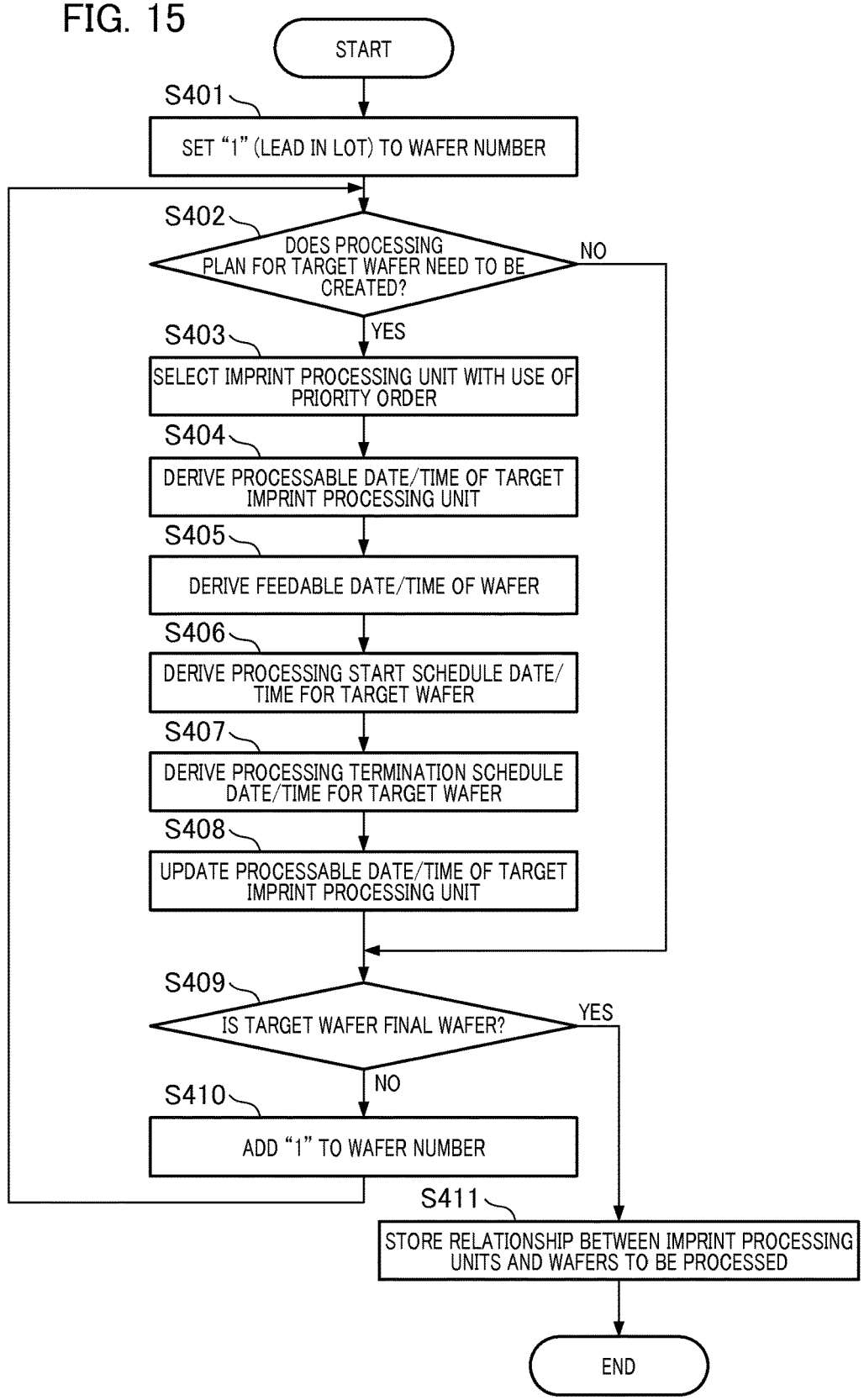
FIG. 15 is a flowchart illustrating a wafer allocation step with the use of priority.

Next, a detailed description will be given of allocation of the wafers W to the processing units 4 in step S102 shown in FIG. 5 in the present embodiment. FIG. 15 is a flowchart illustrating the flow of the allocation step of the wafers W when the list in which the order of priority is defined is used. Firstly, prior to the following repetition processing, the job execution unit 305 sets the initial value "1" to the leading number of wafers in a lot (step S401). Next, the job execution unit 305 determines whether or not the processing plan for the target wafer W needs to be created (step S402). Here, if the job execution unit 305 determines that no such processing plan needs to be created (NO), the processing shifts to the following step S409. On the other hand, if the job execution unit 305 determines in step S402 that the processing plan needs to be created (YES), the job execution unit 305 selects the processing unit 4 to be used for processing the target wafer W (step S403). The selecting step of the processing unit 4 will be described below in detail. Next, the job execution unit 305 confirms the operating status of the selected processing unit 4 and then derives the date/time (hereinafter referred to as "processable date/time") at which the processing unit 4 can start the wafer processing (step S404). Here, the processable date/time is current date/time if the processing unit 4 is in a processing standby state, whereas the processable date/time is the predicted next date/time (the date/time at which new processing can be received) at which the processing unit 4 becomes in a processing standby state if the processing unit 4 is in processing. Next, the job execution unit 305 derives the date/time (hereinafter referred to as "feedable date/time") at which the substrate conveyance unit 5 can feed the target wafer W to the processing unit 4 (step S405). Next, the job execution unit 305 compares the processable date/time derived in step S404 with the feedable date/time derived in step S405 to derive the later date/time as the processing start schedule date/time for the target wafer W (step S406). The following steps S407 to S411 respectively correspond to steps S207 to S211 shown in FIG. 6 and explanation thereof will be omitted.

Figure 16:
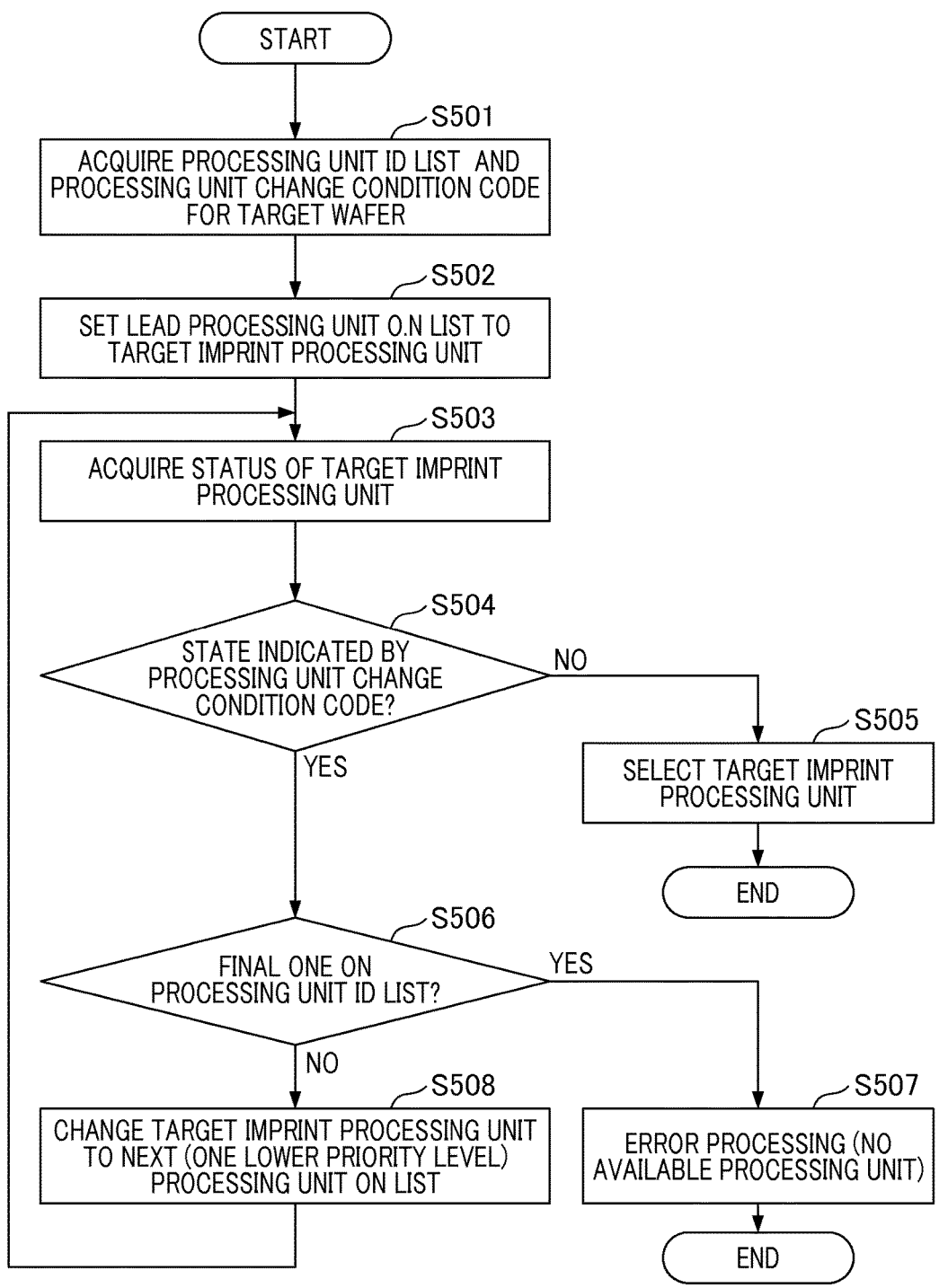
FIG. 16 is a flowchart illustrating a selecting step according to the third embodiment.

Next, a detailed description will be given of selection of the processing unit 4 to be used for processing the target wafer W in step S403. FIG. 16 is a flowchart illustrating the flow of the selecting step of the processing unit 4 in the present embodiment. Firstly, the job execution unit 305 acquires the processing unit ID list relating to the target wafers W generated by the list generation unit 13 and the processing unit change conditions from the main controller 301 (step S501). Next, the job execution unit 305 sets the processing unit 4 with the highest order of priority on the processing unit ID list (the leading one of the list) to the target processing unit (step S502). Next, the job execution unit 305 acquires information regarding the operating status of the target processing unit 4 (step S503). Next, the job execution unit 305 compares the state indicated by the processing unit change condition code acquired in step S501 with the state of the target processing unit 4 indicated by information regarding the operating status of the target processing unit 4 acquired in step S503 to determine whether or not both states match (step S504). Here, if the job execution unit 305 determines that both states do not match (NO), the target processing unit 4 is selected as the processing unit to be used for processing the target wafer W (step S505). On the other hand, if the job execution unit 305 determines that both states match (YES), the job execution unit 305 determines whether or not the target processing unit 4 is the processing unit 4 with the lowest order of priority (the rear end on the list) from among the processing units 4 as candidates on the processing unit ID list (step S506). Here, if the job execution unit 305 determines that the target processing unit 4 is the one with the lowest order of priority (YES), error processing for notifying the supervisory controller 10 of the fact that the processing unit 4 to be used for processing the target wafer W is unselectable is performed (step S507). On the other hand, if the job execution unit 305 determines that the target processing unit 4 is not the one with the lowest order of priority (NO), the target processing unit is changed to the processing unit 4 which is defined at a lower priority level on the processing unit ID list, and the processing returns back to step S503 (step S508).

As described above, according to the present embodiment, the cluster apparatus 2 can select the processing unit 4 having a superior characteristic for a specific performance as the processing unit for processing the target wafer W. Furthermore, when an unacceptable event occurs, the cluster apparatus 2 allocates the processing of the wafers W to other processing unit 4 which meets the required performance, so that a reduction in productivity may be suppressed. For example, if the processing unit ID list ranked by pattern formation accuracy is used and the processing unit 4 at a higher level in the list is defective, the processing of the wafers W can be performed by the processing unit 4 with higher order of priority from among the processing units 4 of which the accuracy falls within an allowable range. Thus, according to the present embodiment, as in the first embodiment, a cluster-type lithography apparatus and a lithography system advantageous in terms of suppressing a reduction in productivity while ensuring an improvement in pattern formation accuracy may be provided.

Fourth Embodiment

Figure 17:
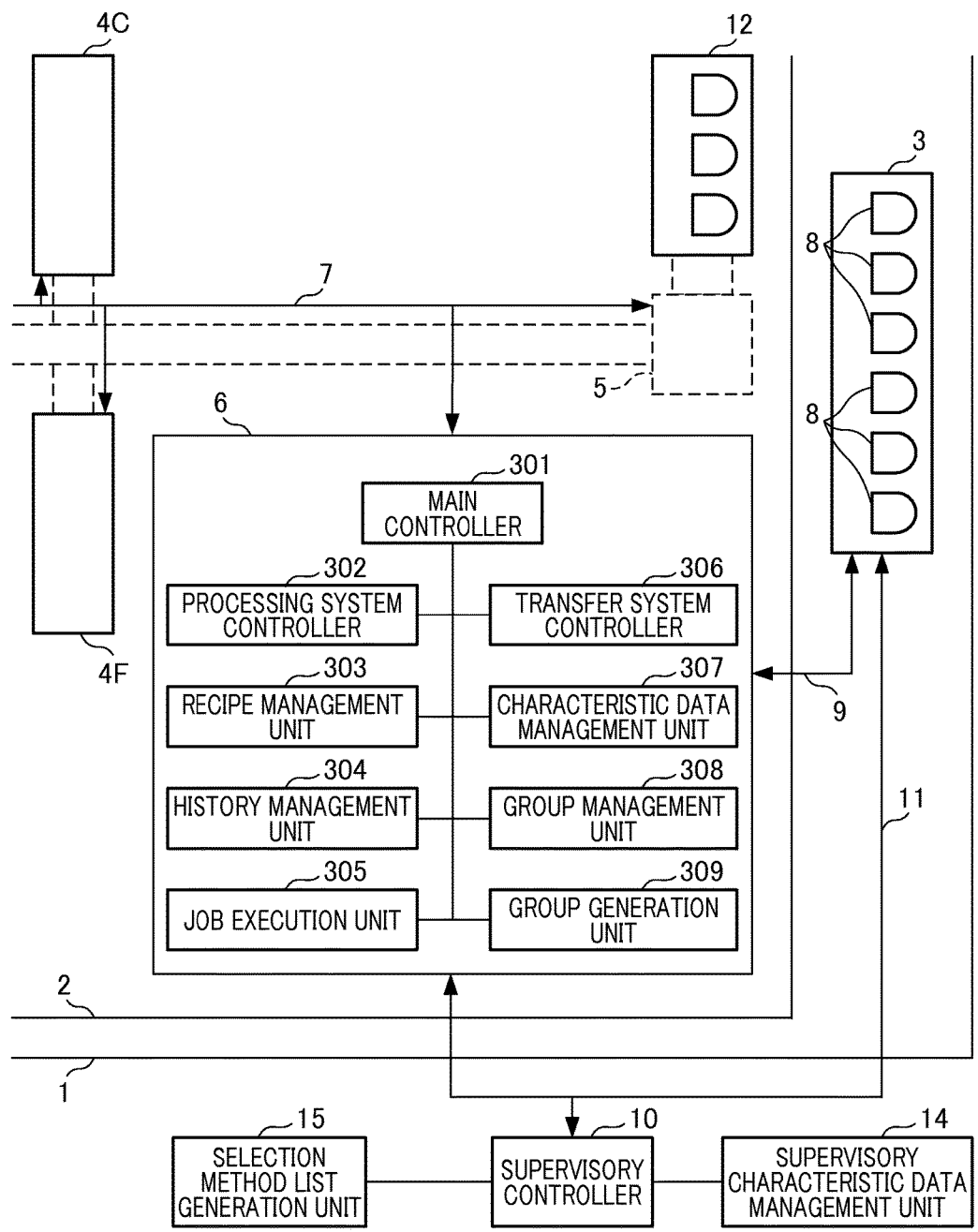
FIG. 17 is a partial diagram illustrating a configuration focusing on a cluster controller according to a fourth embodiment.

Next, a description will be given of a lithography apparatus according to a fourth embodiment of the present invention. FIG. 17 is a partial block diagram illustrating a configuration focusing on a cluster controller included in the lithography apparatus according to the present embodiment. In FIG. 17, for convenience in explanation, the same components as those corresponding to the imprint system 1 in the third embodiment are designated by the same reference numerals and explanation thereof will be omitted. A feature of the lithography apparatus according to the present embodiment lies in the fact that the cluster controller 6 in the lithography apparatus (the cluster apparatus 2) according to the first embodiment obtains a selection method list defining the order of priority of the selection method of the processing unit 4 from a selection method list generation unit 15 via the supervisory controller 10. The selection method list generation unit 15 is communicatively connected to the cluster controller 6 and the supervisory characteristic data management unit 14 via the supervisory controller 10, and receives/transmits a control signal and various types of information from/to the cluster controller 6 and the supervisory characteristic data management unit 14. The selection method list generation unit 15 acquires characteristic data from the supervisory characteristic data management unit 14 via the supervisory controller 10, and then generates a selection method list in which the order of priority of the selection method (allocating condition) of the processing unit 4 is defined upon allocation of the wafers W to the imprint processing units 4 based on the characteristic data. Upon selection of the processing units 4 for executing a job, the job execution unit 305 refers to the selection method list and information regarding the operating status of the processing units 4 such as an alarm occurrence state, a maintenance plan, or the like. In this manner, the processing unit 4 to be selected and its selection method may be changed depending on the operating status of the entire cluster apparatus 2.

FIGS. 18A and 18B are tables illustrating an exemplary selection method list generated by the selection method list generation unit 15. FIG. 18A is an example of the selection method list defining the order of priority of the selection method of the processing unit 4 and FIG. 18B is a table illustrating the status of processing unit change condition codes shown in FIG. 18A. Here, the candidates of the selection method used upon allocation of the wafers W to the processing units 4 are "group ID", "allowable error", and "ID list". The term "group ID" refers to a group ID specifying method described in the first embodiment and a method for specifying the processing units 4 to be used in group units. The term "allowable error" refers to an allowable error specifying method described in the second embodiment and a method for generating the group of the processing units 4 which meet an allowable error by specifying it in a target lot. The term "ID list" refers to an ID list specifying method described in the third embodiment and a method for selecting the processing unit 4 using the list in which the order of priority of the processing units 4 is defined. When, for example, the processing plan for the wafer having the wafer ID of "L1W1" is created by using the selection method lists shown in FIGS. 18A and 18B, the methods as candidates for selection are "group ID" and "ID list". The processing units 4 which are set as available candidates by using the "ID list" having the method number of "1" with a higher priority level are "HD01" and "HD02" in the order of priority. If the operating status of the processing unit 4 having the processing unit ID of "HD01" at a higher priority level meets the change condition: "C1: imprint processing unit is defective", the job execution unit 305 selects the processing unit 4 having the processing unit ID of "HD02" at a lower priority level as the processing unit 4 to be used for processing the wafer W having the wafer ID of "L1W1". In addition, if the operating status of both processing units 4 having the processing unit IDs of "HD01" and "HD02" meets the change condition: "C1: imprint processing unit is defective", the job execution unit 305 selects "group ID" having the method number of "2" at a lower priority level as the selection method of the processing unit 4.

Figure 19:
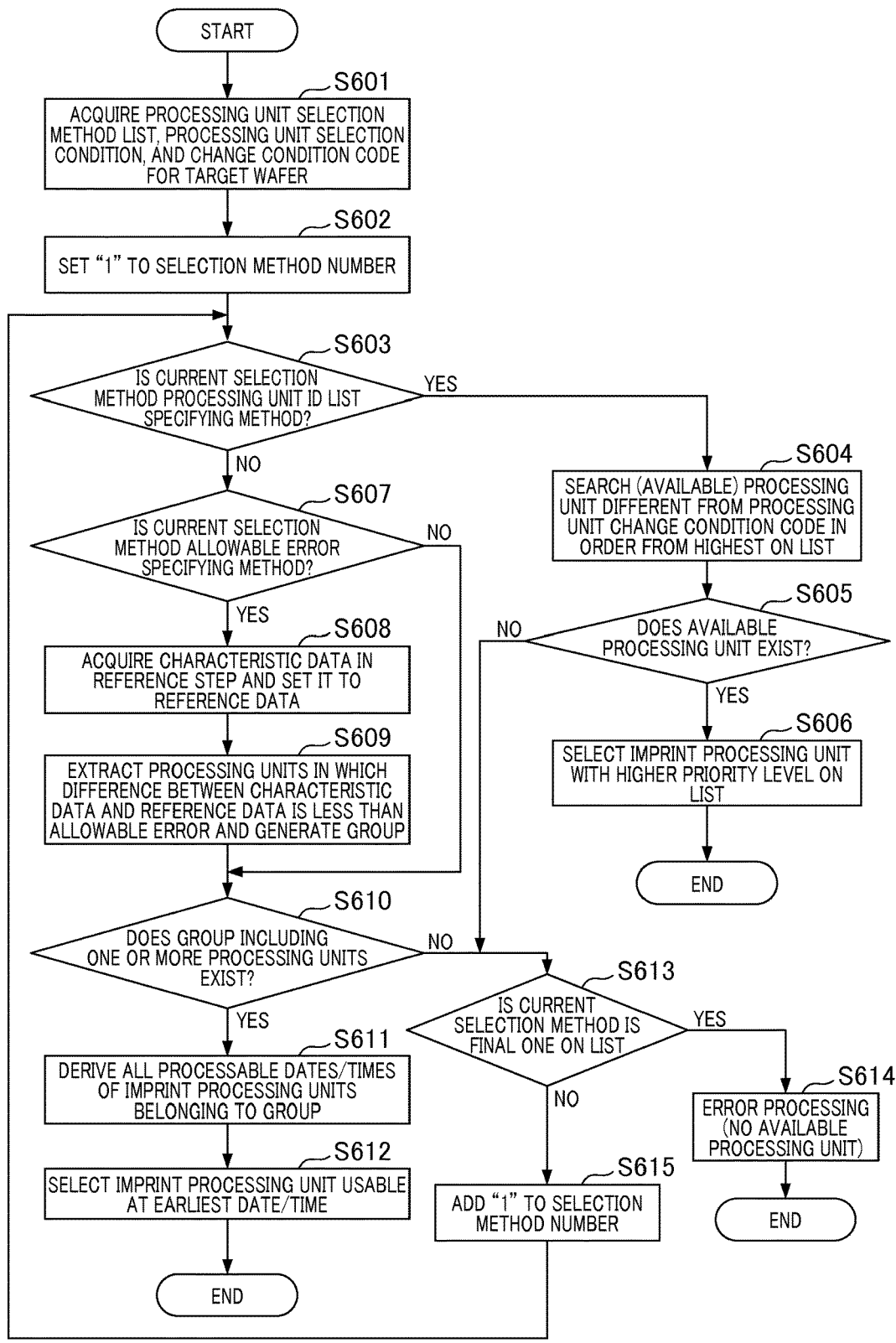
FIG. 19 is a flowchart illustrating a selecting step according to the fourth embodiment.

Next, a detailed description will be given of selection of the processing unit 4 to be used for processing the target wafer W in the present embodiment. FIG. 19 is a flowchart illustrating the flow of the selecting step of the processing unit 4 in the present embodiment. Firstly, the job execution unit 305 acquires the selection method list relating to the target wafers W generated by the selection method list generation unit 15 and the processing unit change conditions from the main controller 301 (step S601). Next, the job execution unit 305 sets the selection method having the selection method number of "1" with the highest priority level on the selection method list (step S602). Then, the job execution unit 305 determines whether or not the method set in step S603 is the ID list specifying method (step S603). Here, if the job execution unit 305 determines that the current selection method is the ID list specifying method (YES), the job execution unit 305 searches the available processing unit 4 which does not meet the processing unit change condition (step S604). At this time, the job execution unit 305 searches the processing units 4 in the order from the processing unit 4 with highest priority among the processing units 4 as candidates for selection while taking into consideration of the operating status of the entire cluster apparatus 2. Next, the job execution unit 305 determines whether or not available processing units 4 exist as the result of searching in step S604 (step S605). Here, if the job execution unit 305 determines that available processing units 4 exist (YES), the job execution unit 305 selects the processing unit 4 with the highest priority level from among the available processing units 4 (step S606). Upon selection of the processing unit 4 in step S606, the processing shifts to step S404 shown in FIG. 15 to derive the processable date/time for the selected target processing unit 4.

On the other hand, if the job execution unit 305 determines in step S603 that the current selection method is not the ID list specifying method (NO), the job execution unit 305 determines whether or not the current selection method is the allowable error specifying method (step S607). Here, if the job execution unit 305 determines that the current selection method is not the allowable error specifying method (NO), it means that the current selection method is the group ID specifying method, and the processing shifts to the following step S610. On the other hand, if the job execution unit 305 determines in step S607 that the current selection method is the allowable error specifying method (YES), characteristic data in the reference step is set to reference data according to the flowchart shown in FIG. 12 (step S608). Next, the job execution unit 305 extracts the processing units 4 in which a difference between the characteristic data and the reference data is less than the allowable error to thereby generate the groups of the extracted processing units 4 (step S609). Next, the job execution unit 305 determines whether or not a group including one or more available processing units 4 exists (step S610). Here, if the job execution unit 305 determines that a group including one or more available processing units 4 exists (YES), the job execution unit 305 derives all the processable dates/times of the processing units 4 included in the group (step S611). Next, the job execution unit 305 selects the processing unit 4 having the earliest date/time from among the processable dates/times derived in step S611 (step S612). Upon selection of the processing unit 4 in step S612, the processing shifts to step S405 shown in FIG. 15. Upon calculation of the processing start schedule date/time in step S406, the processtable date/time derived in step S611 is used.

On the other hand, if the job execution unit 305 determines in step S605 that no available processing unit 4 exists (NO) or if the job execution unit 305 determines in step S610 that no group including one or more available processing units 4 exists (NO), the processing shifts to step S613. In step S613, the job execution unit 305 determines whether or not the current selection method is the selection method with the lowest priority level among the selection methods as candidates on the selection method list. Here, if the job execution unit 305 determines that the current selection method is the selection method with the lowest priority level (YES), error processing for notifying the supervisory controller 10 of the fact that the processing unit 4 to be used is unselectable is performed (step S614). On the other hand, if the job execution unit 305 determines in step S613 that the current selection method is not the selection method with the lowest priority level (NO), the job execution unit 305 adds "1" to the selection method number, and returns the processing back to step S603 by lowering the order of priority of the selection method by one level (step S615).

As described above, according to the present embodiment, the cluster apparatus 2 can use an appropriate selection method depending on the operating status of the entire cluster apparatus 2 upon selection of the processing unit 4 to be used for processing the wafer W. Thus, the cluster apparatus 2 can flexibly select the processing unit to be used, so that the productivity of the entire system can be improved while suppressing an increase in load on the supervisory controller 10 at a higher level.

Furthermore, the above description has been given by taking an example of a cluster-type imprint apparatus including a plurality of imprint processing units (imprint apparatuses) as lithography apparatuses. It should be noted that the present invention is not limited thereto but may also be applicable to a cluster-type drawing apparatus or the like including a plurality of drawing units (drawing apparatuses) that perform drawing processing for a substrate (photosensitive material on a substrate) using charged particle beams such as electron beams.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2014-055809 filed on Mar. 19, 2014, and Japanese Patent Application No. 2015-033180 filed on Feb. 23, 2015 which are hereby incorporated by reference herein in their entirety.

What is claimed is:

1. A lithography apparatus that communicates with a supervisory controller to generate a processing plan for allocating a plurality of substrates among a plurality of processing units, the lithography apparatus comprising:

the plurality of processing units each of which is configured to perform processing of pattern formation for substrates in accordance with the processing plan; and a controller configured to manage the plurality of processing units as groups in accordance with data indicating an overlay accuracy or a resolution width of the processing unit in performing processing of the pattern formation, and allocate the respective substrates included in one or more lots to respective processing units of the groups, wherein, prior to starting parallel processing of the plurality of the substrates, the controller is configured to:

generate the processing plan by:
identifying which processing units of the plurality of processing units are available to perform processing of the pattern formation;
requesting a data of overlay accuracy or resolution width required for a predetermined pattern formation processing to the supervisory controller if no processing history of the predetermined pattern formation processing for the substrates performed by the plurality of processing units exists;
acquiring the data of overlay accuracy or resolution width required for the predetermined pattern formation processing from the supervisory controller as reference data; and
generating the group of the processing units satisfying a condition that a difference between the data indicating the overlay accuracy or the resolution width of the processing unit in performing processing of the pattern formation and the reference data indicating the overlay accuracy or the resolution width required for the predetermined pattern formation processing falls within a predetermined tolerance value; and
associating the group of the processing units with the predetermined pattern formation processing in the processing plan; and send the processing plan including an information of the generated group to the supervisory controller, wherein, after receiving start instructions from the supervisory controller, the controller is configured to perform parallel processing for a plurality of the substrates using the processing units belonging to the group based on the processing plan and the start instructions, and wherein, if an unprocessed substrate allocated to the group still exists upon a standby state of a processing unit included in the group, the controller is configured to allocate the unprocessed substrate to the processing unit in the standby state and then cause the processing units to perform parallel processing for the substrates based on the allocation.

2. The lithography apparatus according to claim 1, wherein, if part of processing units included in the group are in the standby state and an unprocessed substrate allocated to other processing units not in the standby state included in the group exists, the controller is configured to allocate the unprocessed substrate to the processing unit in the standby state.

3. A method of controlling a lithography apparatus that communicates with a supervisory controller to generate a processing plan for allocating a plurality of substrates among a plurality of processing units for causing the plurality of processing units to perform processing of pattern formation in parallel for substrates, the method comprising:

managing the plurality of processing units as groups in accordance with data indicating an overlay accuracy or a resolution width of the processing unit in performing processing of the pattern formation;

allocating the respective substrates included in one or more lots to respective processing units of the groups and allocating an unprocessed substrate to a processing unit in a standby state if the unprocessed substrate allocated to the group still exist upon the standby state of the processing unit included in the group; and causing the processing units to perform parallel processing for the substrates based on the allocation determined in the allocating, wherein, prior to starting parallel processing of a plurality of the substrates, the method further includes:

generating the processing plan by:
identifying which processing units of the plurality of processing units are available to perform processing of the pattern formation;
requesting a data of overlay accuracy or resolution width required for a predetermined pattern formation processing to the supervisory controller if no processing history of the predetermined pattern formation processing for the substrates performed by the plurality of processing units exists;
acquiring the data of overlay accuracy or resolution width required for the predetermined pattern formation processing from the supervisory controller as reference data;
generating the group of the processing units satisfying a condition that a difference between the data indicating the overlay accuracy or the resolution width of the processing unit in performing processing of the pattern formation and the reference data indicating the overlay accuracy or the resolution width required for the predetermined pattern formation processing falls within a predetermined tolerance value; and
associating the group of the processing units with the predetermined pattern formation processing in the processing plan;

sending the processing plan including an information of the generated group to the supervisory controller; and after receiving start instructions from the supervisory controller, performing parallel processing for a plurality of the substrates using the processing units belonging to the group based on the processing plan and the start instructions.

4. The lithography method according to claim 3, further comprising:

creating a group to which only one processing unit belongs from the plurality of processing units; and designating the group as a pattern formation characteristic for the substrates.

5. A non-transitory storage medium on which is stored a computer program for making a computer execute a method of controlling a lithography apparatus that communicates with a supervisory controller to generate a processing plan for allocating a plurality of substrates among a plurality of processing units for causing the plurality of processing units to perform processing of pattern formation in parallel for substrates, the method comprising:

managing the plurality of processing units as groups in accordance with data indicating an overlay accuracy or a resolution width of the processing unit in performing processing of the pattern formation;

allocating the respective substrates included in one or more lots to respective processing units of the groups and allocating an unprocessed substrate to a processing unit in a standby state if the unprocessed substrate allocated to the group still exist upon the standby state of the processing unit included in the group; and causing the processing units to perform parallel processing for the substrates based on the allocation determined in the allocating, wherein, prior to starting parallel processing of a plurality of the substrates, the method further includes:

generating the processing plan by:
- identifying which processing units of the plurality of processing units are available to perform processing of the pattern formation;
- requesting a data of overlay accuracy or resolution width required for a predetermined pattern formation processing to the supervisory controller if no processing history of the predetermined pattern formation processing for the substrates performed by the plurality of processing units exists;
- acquiring the data of overlay accuracy or resolution width required for the predetermined pattern formation processing from the supervisory controller as reference data;
- generating the group of the processing units satisfying a condition that a difference between the data indicating the overlay accuracy or the resolution width of the processing unit in performing processing of the pattern formation and the reference data indicating the overlay accuracy or the resolution width required for the predetermined pattern formation processing falls within a predetermined tolerance value; and
- associating the group of the processing units with the predetermined pattern formation processing in the processing plan;

sending the processing plan including an information of the generated group to the supervisory controller; and after receiving start instructions from the supervisory controller, performing parallel processing for a plurality of the substrates using the processing units belonging to the group based on the processing plan and the start instructions.

6. An article manufacturing method comprising:

forming a pattern on a substrate using a lithography apparatus that communicates with a supervisory controller to generate a processing plan for allocating a plurality of substrates among a plurality of processing units, the lithography apparatus comprising:

the plurality of processing units each of which is configured to perform processing of pattern formation for substrates in accordance with the processing plan; and a controller configured to manage the plurality of processing units as groups in accordance with data indicating an overlay accuracy or a resolution width of the processing unit in performing processing of the pattern formation, and allocate the respective substrates included in one or more lots to respective processing units of the groups, wherein, prior to starting parallel processing of the plurality of the substrates, the controller is configured to:

generate the processing plan by:
- identifying which processing units of the plurality of processing units are available to perform processing of the pattern formation;
- requesting a data of overlay accuracy or resolution width required for a predetermined pattern formation processing to the supervisory controller if no processing history of the predetermined pattern formation processing for the substrates performed by the plurality of processing units exists;
- acquiring the data of overlay accuracy or resolution width required for the predetermined pattern formation processing from the supervisory controller as reference data; and
- generating the group of the processing units satisfying a condition that a difference between the data indicating the overlay accuracy or the resolution width of the processing unit in performing processing of the pattern formation and the reference data indicating the overlay accuracy or the resolution width required for the predetermined pattern formation processing falls within a predetermined tolerance value; and
- associating the group of the processing units with the predetermined pattern formation processing in the processing plan; and send the processing plan including an information of the generated group to the supervisory controller, wherein, after receiving start instructions from the supervisory controller, the controller is configured to perform parallel processing for a plurality of the substrates using the processing units belonging to the group based on the processing plan and the start instructions, and wherein, if an unprocessed substrate allocated to the group still exists upon a standby state of a processing unit included in the group, the controller is configured to allocate the unprocessed substrate to the processing unit in the standby state and then cause the processing units to perform parallel processing for the substrates based on the allocation; and processing the substrate on which the pattern has been formed in the forming.

* * * * *